United States Patent
Kubota et al.

(10) Patent No.: US 8,017,307 B2
(45) Date of Patent: Sep. 13, 2011

(54) METHOD FOR MANUFACTURING MINUTE STRUCTURE, METHOD FOR MANUFACTURING LIQUID DISCHARGE HEAD, AND LIQUID DISCHARGE HEAD

(75) Inventors: Masahiko Kubota, Tokyo (JP); Takumi Suzuki, Yokohama (JP); Tamaki Sato, Kawasaki (JP); Ryoji Kanri, Zushi (JP); Maki Hatta, Tokyo (JP); Kazuhiro Asai, Atsugi (JP); Shoji Shiba, Kawasaki (JP); Hiroe Ishikura, Kawasaki (JP); Akihiko Okano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1270 days.

(21) Appl. No.: 10/568,341

(22) PCT Filed: Jun. 27, 2005

(86) PCT No.: PCT/JP2005/012270
§ 371 (c)(1),
(2), (4) Date: Feb. 14, 2006

(87) PCT Pub. No.: WO2006/001534
PCT Pub. Date: Jan. 5, 2006

(65) Prior Publication Data
US 2007/0011875 A1    Jan. 18, 2007

(30) Foreign Application Priority Data
Jun. 28, 2004   (JP) .................................. 2004-190481

(51) Int. Cl.
*G03F 7/20*   (2006.01)

(52) U.S. Cl. ....................................... 430/320; 430/322

(58) Field of Classification Search .................. 430/311, 430/322, 320
See application file for complete search history.

(56) References Cited

U.S. PATENT DOCUMENTS

| | | |
|---|---|---|
| 3,143,307 A | 8/1964 | Baker |
| 4,393,129 A | 7/1983 | Glashauser et al. |
| (Continued) | | |

FOREIGN PATENT DOCUMENTS

CN    1475350 A    2/2004
(Continued)

OTHER PUBLICATIONS

J.V. Crivello et al., "New Photoinitiators for Cationic Polymerization," 56 J. Polymer Sci. 383-95 (1976).

*Primary Examiner* — Kathleen Duda
*Assistant Examiner* — Brittany Raymond
(74) *Attorney, Agent, or Firm* — Fitzpatrick, Cella, Harper & Scinto

(57) ABSTRACT

A method for manufacturing a minute structure comprises a step of forming an ionizing radiation decomposing type positive type resist layer including a methyl isopropenyl ketone as a first positive type photosensitive material layer, a step of forming an ionizing radiation decomposing type positive type resist layer including a photosensitive material of a copolymer as a second positive type photosensitive material layer to be sensitized by an ionizing radiation of a second wavelength range on the first positive type photosensitive material layer, a step of forming a desired pattern in the above-mentioned second positive type photosensitive material layer, and development using a developing solution, and then, a step of forming a desired pattern in the above-mentioned first positive type photosensitive material layer to form a convex shape pattern.

4 Claims, 11 Drawing Sheets

U.S. PATENT DOCUMENTS

| | | | |
|---|---|---|---|
| 4,565,859 A | 1/1986 | Murai et al. | |
| 4,841,017 A | 6/1989 | Murai et al. | |
| 4,882,595 A | 11/1989 | Trueba et al. | |
| 5,218,376 A | 6/1993 | Asai | |
| 5,331,344 A | 7/1994 | Miyagawa et al. | 347/65 |
| 5,478,606 A | 12/1995 | Ohkuma et al. | |
| 5,730,889 A | 3/1998 | Miyagawa et al. | 216/27 |
| 6,155,673 A | 12/2000 | Nakajima et al. | |
| 6,158,843 A | 12/2000 | Murthy et al. | |
| 6,461,798 B1 * | 10/2002 | Ohkuma et al. | 430/320 |
| 6,488,364 B1 | 12/2002 | Nakajima et al. | |
| 6,895,668 B2 | 5/2005 | Imamura | |
| 6,960,424 B2 | 11/2005 | Miyagawa et al. | |
| 6,986,980 B2 | 1/2006 | Kubota et al. | |
| 2004/0070643 A1 * | 4/2004 | Kubota et al. | 347/20 |
| 2004/0072107 A1 | 4/2004 | Kubota et al. | |
| 2004/0131957 A1 | 7/2004 | Kubota et al. | 430/15 |
| 2005/0181309 A1 | 8/2005 | Miyagawa et al. | |

FOREIGN PATENT DOCUMENTS

| | | |
|---|---|---|
| CN | 1476977 A | 2/2004 |
| EP | 0 491 560 A2 | 6/1992 |
| EP | 0 734 866 A2 | 10/1996 |
| EP | 1 380 422 A1 | 1/2004 |
| EP | 1 380 425 A1 | 1/2004 |
| GB | 2 152 223 A | 7/1985 |
| JP | 57-100429 A | 6/1982 |
| JP | 60-161973 A | 8/1985 |
| JP | 62-221121 A | 9/1987 |
| JP | 64-9216 A | 1/1989 |
| JP | 2-140219 A | 5/1990 |
| JP | 4-10940 A | 1/1992 |
| JP | 4-10941 A | 1/1992 |
| JP | 10-291317 A | 11/1998 |
| JP | 2000-326515 A | 11/2000 |
| JP | 2003-25595 A | 1/2003 |
| JP | 2004-42396 A | 2/2004 |
| JP | 2004-42650 A | 2/2004 |
| JP | 2004-46217 A | 2/2004 |
| JP | 6-45242 A | 5/2007 |
| KR | 2004-5692 A | 1/2004 |

\* cited by examiner

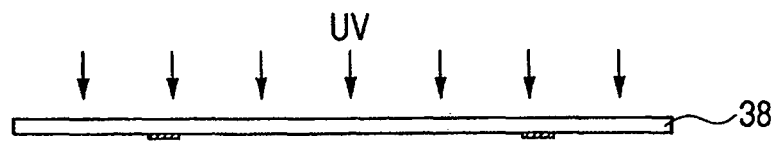
FIG. 5A
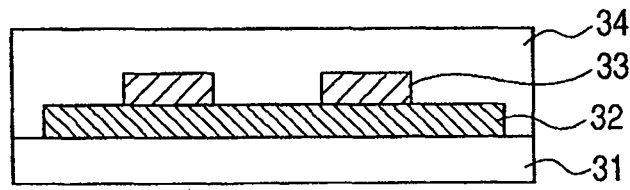
FIG. 5B
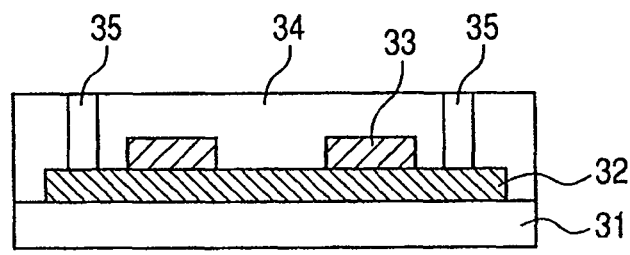
FIG. 5C
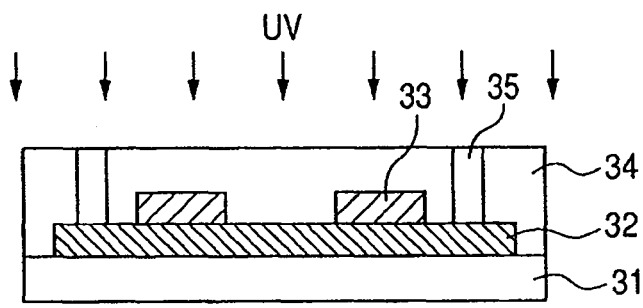
FIG. 5D
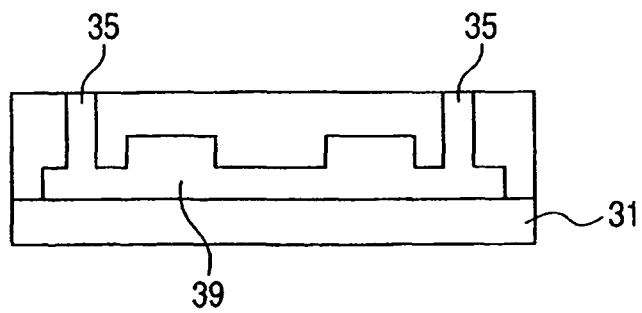

METHOD FOR MANUFACTURING MINUTE STRUCTURE, METHOD FOR MANUFACTURING LIQUID DISCHARGE HEAD, AND LIQUID DISCHARGE HEAD

TECHNICAL FIELD

The present invention relates to a method for manufacturing a minute structure using a photosensitive resin, and a liquid discharge head for generating recording liquid small droplets used for the ink jet recording system and a method for manufacturing the head. In particular, the present invention relates to a method for manufacturing a head comprising an ink liquid flow path shape, capable of stably discharging minute liquid droplets enabling a high image quality, and furthermore capable of realizing a high speed recording operation. Furthermore, the present invention relates to an ink jet head with the ink discharge properties improved, based on the above-mentioned method for manufacturing an ink jet head.

BACKGROUND ART

A liquid discharge head applied for the ink jet recording system (liquid discharge recording system) for recording by discharging a recording liquid such as an ink in general comprises a liquid flow path, a liquid discharge energy generating part provided in a part of the liquid flow path, and a minute recording liquid discharge port for discharging the liquid in the above-mentioned liquid flow path by the thermal energy of the liquid discharge energy generating part (hereinafter it is referred to as the "orifice").

Conventionally, as a method for manufacturing such a liquid discharge recording head, for example, Japanese Patent Application Publication No. H06-45242 discloses a method for manufacturing an ink jet head, comprising the steps of patterning a mold of an ink liquid flow path with a photosensitive material on a substrate with a liquid discharge energy generating element formed, then applying and forming a coating resin layer on the above-mentioned substrate so as to coat the mold pattern, forming an ink discharge port communicating with the mold of the above-mentioned ink liquid flow path on the coating resin layer, and thereafter removing the photosensitive material used for the mold (hereinafter, it is also abbreviated as the "mold injection method"). According to the production method for a head, a positive type resist is used as the photosensitive material from the viewpoint of the removal easiness. Moreover, according to the production method, since the semiconductor photolithography technique is adopted, an extremely highly accurate and minute process is enabled for the formation of the ink liquid flow path, the discharge port, or the like. However, according to the production method adopting the semiconductor production method, basically, the shape change in the vicinity of the ink liquid flow path and the discharge port is limited to the change in the two-dimensional direction parallel to the element substrate. That is, since the photosensitive material layer cannot be provided partially in a multiple layers due to the use of the photosensitive material for the mold of the ink liquid flow path and the discharge port, a desired pattern with the change in the height direction cannot be obtained in the mold for the ink liquid flow path, or the like (the height direction shape from the element substrate is uniformly limited). As a result, it becomes the limitation in the ink liquid flow path design for realizing the high speed and stable discharge.

As a technique for solving the same, Japanese Patent Application Laid-Open No. 2003-25595 proposes forming an intermediate chamber with dissolvable resins in two layers and the cross-sectional area in the discharge port lower part that is enlarged (an intermediate portion narrower than the substrate side liquid flow path and wider than the discharge port top end part is provided between the substrate side liquid flow path and the discharge port top end). Moreover, the official gazette discloses a specific example of using a thermally cross-linkable positive type resist including a PMMA (polymethyl methacrylate) for the lower layer of the removable two layer resins and using a PMIPK (polymethyl isopropyl ketone) for the upper layer.

On the other hand, Japanese Patent Application Laid-Open No. 2004-042396 discloses a method for manufacturing an ink jet recording head using for the liquid flow path forming mold material, a copolymer of an ester methacrylate and a methacrylic acid as a thermal cross linking factor as the resin used for a solid layer for manufacturing a mold for forming the liquid flow path. Furthermore, Japanese Patent Application Laid-Open No. 2004-42650 discloses a method for manufacturing an ink jet recording head using for the mold material for forming a liquid flow path, a thermally cross linkable positive type resist as a copolymer of a methacrylic anhydride as a factor for widening the sensitive area, including an ester methacrylate.

By forming the mold material for forming a liquid flow path of a liquid discharge head in a two layer laminated structure using two kinds of positive type resists, the flexibility in designing the minute liquid flow path structure for a liquid discharge head can be widened. However, for providing a further minute liquid discharge head structure, a technique for forming a minute structure further accurately is called for. For example, in some cases the lower layer of the mold material for the liquid flow path comprising the two-layer structure may need to be thick to some extent. In this case, if the positive type resist for forming the lower layer of the mold material for the two layer structure liquid flow path is thermally cross linkable type as disclosed in Japanese Patent Application Laid-Open Nos. 2003-25595, 2004-042396 and 2004-42650, there would be many limitations in terms of the design and the production method, such as:

1. the difficulty in providing a thick film due to the film stress limitation (maximum: 10 µm is the limit);
2. generation of cracking at the time of forming a pattern (cracking in the bent pattern derived from the stress alleviation at the time of the development);
3. generation of cracking, or the like due to application shock derived from the grade difference on the substrate by applying a coating solution including a solvent onto a thermally cross linkable film;
4. increase of the necessary exposure amount at the time of patterning due to reduction of the decomposition rate by the exposure by the mesh like three-dimensional structure at the time of the thermally cross linkable film formation; and
5. increase of the exposure amount for decomposition at the time of finally removing the mold material.

DISCLOSURE OF THE INVENTION

An object of the present invention is to provide a method for forming a minute structure without the need of the thermal cross linking process (high temperature process) in at least the lower layer in the case of production of the above-mentioned minute structure of the two layer structure with two kinds of positive type resists, without generation of the above-mentioned problems. Furthermore, an object of the present invention is to provide a method for manufacturing a liquid discharge head, utilizing the method for forming a minute structure.

The present invention capable of achieving the above-mentioned objects is characterized in first realizing a production method for forming a three-dimensionally shaped liquid flow path by high accuracy, and then finding out a good liquid flow path shape to be realized by the production method. Furthermore, the present invention is characterized in forming the above-mentioned three-dimensionally shaped liquid flow path highly accurately and inexpensively with a good yield.

Moreover, it is to provide an ink jet recording head compatible to various kinds of inks by widening the design flexibility of the three-dimensionally shaped flow path structure to be formed.

That is, the first invention is a method for manufacturing a minute structure, comprising:

a step of forming an ionizing radiation decomposing type positive type resist layer including a methyl isopropenyl ketone as a first positive type photosensitive material layer to be sensitized by an ionizing radiation (Deep-UV, electron beam, X ray, or the like) of a first wavelength range;

a step of forming an ionizing radiation decomposing type positive type resist layer including a photosensitive material of a copolymer obtained by the copolymerization of an ester methacrylate and a methacrylic acid, with the weight average molecular weight of the copolymer of 50,000 to 300,000 and the ratio of the methacrylic acid included in the copolymer of 5 to 30% by weight as a second positive type photosensitive material layer to be sensitized by an ionizing radiation of a second wavelength range on the first positive type photosensitive material layer;

a step of forming a desired pattern in the above-mentioned second positive type photosensitive material layer as the upper layer by decomposing reaction only in the desired area of the above-mentioned second positive type photosensitive material layer without decomposing reaction of the above-mentioned first positive type photosensitive material layer by directing an ionizing radiation of the above-mentioned second wavelength range via a mask to the substrate surface with the first and second positive type photosensitive material layers formed, and development using a developing solution; and a step of forming a desired pattern in the above-mentioned first positive type photosensitive material layer as the lower layer by decomposing reaction of a predetermined area of at least the above-mentioned first positive type photosensitive material layer by direction an ionizing radiation of the above-mentioned first wavelength range via a mask to the substrate surface with the first and second positive type photosensitive material layers formed, and development, successively, characterized in that a pattern of a convex shape is manufactured in the substrate by executing the above-mentioned steps.

The second invention is characterized in that an ionizing radiation decomposing type positive type resist including a photosensitive material as a copolymer obtained by the copolymerization of an ester methacrylate and a methacrylic anhydride, with the weight average molecular weight of the copolymer of 10,000 to 100,000 and the ratio of the methacrylic anhydride included in the copolymer of 5 to 30% by weight is used as the above-mentioned second positive type photosensitive material layer in the first invention.

The third invention is a method for manufacturing a liquid discharge head comprising a step of forming a mold pattern with a removable resin in a liquid flow path forming portion on a substrate with a liquid discharge energy generating element formed, applying and hardening a coating resin layer on the above-mentioned substrate so as to coat the mold pattern, and dissolving and removing the above-mentioned mold pattern so as to form a liquid flow path, characterized in that the above-mentioned step of forming a mold pattern comprises:

a step of forming an ionizing radiation decomposing type positive type resist layer including a methyl isopropenyl ketone as the first positive type photosensitive material layer to be sensitized by an ionizing radiation beam of the first wavelength range on the substrate;

a step of forming an ionizing radiation decomposing type positive type resist layer including a photosensitive material of a copolymer obtained by the copolymerization of an ester methacrylate and a methacrylic acid, with the weight average molecular weight of the copolymer of 50,000 to 300,000 and the ratio of the methacrylic acid included in the copolymer of 5 to 30% by weight as a second positive type photosensitive material layer to be sensitized by an ionizing radiation of a second wavelength range on the first positive type photosensitive material layer;

a step of forming a desired pattern in the above-mentioned second positive type photosensitive material layer as the upper layer by decomposing reaction only in the desired area of the above-mentioned second positive type photosensitive material layer without decomposing reaction of the above-mentioned first positive type photosensitive material layer by directing an ionizing radiation of the above-mentioned second wavelength range via a mask to the substrate surface with the first and second positive type photosensitive material layers formed, and development using a developing solution; and a step of forming a desired pattern in the above-mentioned first positive type photosensitive material layer as the lower layer by decomposing reaction of a predetermined area of at least the above-mentioned first positive type photosensitive material layer by direction an ionizing radiation of the above-mentioned first wavelength range via a mask to the substrate surface with the first and second positive type photosensitive material layers formed, and development, successively.

The fourth invention is characterized in that an ionizing radiation decomposing type positive type resist including a photosensitive material as a copolymer obtained by the copolymerization of an ester methacrylate and a methacrylic anhydride, with the weight average molecular weight of the copolymer of 10,000 to 100,000 and the ratio of the methacrylic anhydride included in the copolymer of 5 to 30% by weight is used as the above-mentioned second positive type photosensitive material layer in the third invention.

The fifth invention is a method for manufacturing a liquid discharge head comprising a step of forming a mold pattern with a removable resin in a liquid flow path forming portion on a substrate with a liquid discharge energy generating element formed, applying and hardening a coating resin layer on the above-mentioned substrate so as to coat the mold pattern, and dissolving and removing the above-mentioned mold pattern in the method for manufacturing a liquid discharge head so as to form a liquid flow path, characterized in comprising at least:

a step of forming an ionizing radiation decomposing type positive type resist layer including a methyl isopropenyl ketone as the first positive type photosensitive material layer to be sensitized by an ionizing radiation beam of the first wavelength range on the substrate;

a step of forming an ionizing radiation decomposing type positive type resist layer including a photosensitive material of a copolymer obtained by the copolymerization of an ester methacrylate and a methacrylic acid, with the weight average molecular weight of the copolymer of 50,000 to 300,000 and the ratio of the methacrylic acid included in the copolymer of 5 to 30% by weight as a second positive type photosensitive material layer to be sensitized by an ionizing radiation of a second wavelength range on the first positive type photosensitive material layer;

a step of forming a desired pattern in the above-mentioned second positive type photosensitive material layer as the upper layer by decomposing reaction only in the desired area of the above-mentioned second positive type photosensitive material layer without decomposing reaction of the above-mentioned first positive type photosensitive material layer by directing an ionizing radiation of the above-mentioned second wavelength range via a mask to the substrate surface with the first and second positive type photosensitive material layers formed, and development using a developing solution;

a step of forming a desired pattern in the above-mentioned first positive type photosensitive material layer as the lower layer by decomposing reaction of a predetermined area of at least the above-mentioned first positive type photosensitive material layer by direction an ionizing radiation of the above-mentioned first wavelength range via a mask to the substrate surface with the first and second positive type photosensitive material layers formed, and development;

a step of forming a pattern including the discharge port by applying a photosensitive coating resin film onto the first and second positive type photosensitive material layers with the above-mentioned desired pattern formed, exposing a pattern including a discharge opening communicating with the above-mentioned liquid flow path, and development;

a step of decomposing the resin components in the pattern comprising the above-mentioned first and second positive type photosensitive material layers by directing an ionizing radiation beam of a wavelength range for the decomposing reaction of both the above-mentioned first and second positive type photosensitive material layers via the above-mentioned photosensitive coating resin film; and a step of soaking the substrate after having the above-mentioned steps in a predetermined organic solvent for dissolving and removing the pattern comprising the above-mentioned first and second positive type photosensitive material layers.

The sixth invention is characterized in that an ionizing radiation decomposing type positive type resist including a photosensitive material as a copolymer obtained by the copolymerization of an ester methacrylate and a methacrylic anhydride, with the weight average molecular weight of the copolymer of 10,000 to 100,000 and the ratio of the methacrylic anhydride included in the copolymer of 5 to 30% by weight is used as the above-mentioned second positive type photosensitive material layer in the fifth invention.

BRIEF DESCRIPTION OF THE DRAWINGS

FIGS. 5A, 5B, 5C and 5D are diagrams each showing the subsequent steps of the processes of FIGS. 4A to 4G.

BEST MODE FOR CARRYING OUT THE INVENTION

In the following, a liquid discharge head of the present invention will be explained with an example of an ink jet head (IJ head) for recording using mainly ink. The liquid discharge head of the present invention may be of a type used for the applications other than recording, for using various kinds of liquids on various kinds of surfaces. In the specification, the ionizing radiation is a general term for the radiations capable of generating the ionizing function to a substance, such as the deep-UV beam, an electron beam, and a X-ray).

First, for easily understanding of the present invention, the optimization in the nozzle shape design in the liquid discharge head will be explained schematically with reference to FIGS. 10 to 12.

Figure 10:
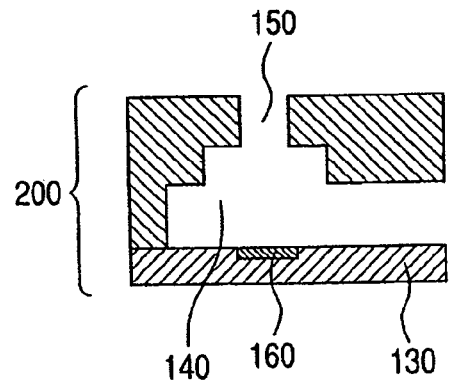
FIG. 10 is a diagram for schematically explaining the optimization of the nozzle shape design.

FIG. 10 shows a nozzle cross-sectional view of an ink jet print head 200 with the configuration of the present invention provided. As to the nozzle filter disposed at a position close to the ink supply port side in an ink flow path (nozzle) disclosed in FIG. 10, it is effective to have the same in the configuration of the present invention in terms of the dust no discharge countermeasure, or the like, however, it may not be provided terms of the effects of the present invention. The ink jet print head having the configuration disclosed in FIG. 10 is an ink jet print head having the configuration with a partition wall (not shown) for forming an individual ink flow path 140 per each discharge port for a plurality of heaters 160 and discharge ports 150, elongating to the vicinity of an ink supply port (not shown). The heaters 160 are formed on a substrate 130.

These ink jet print heads have an ink droplet discharge means characterized in the ink jet recording method disclosed in Japanese Patent Application Laid-Open Nos. H04-10940 and H04-10941, that is, characterized in the communication of bubble generation at the time of discharge with the external atmosphere.

Here, the concept of the optimization of the ink jet print head capable of realizing the high-density arrangement will be explained briefly. As the physical amount that influences the discharge properties of the ink jet print head, the inertance (inertia force) and the resistance (viscosity resistance) in the above-mentioned nozzles arranged in a plurality contribute significantly thereto. The equation of motion of an incompressible fluid moving in an optional shape can be represented by the following two equations.

$$\Delta \cdot v = 0 \text{ (Equation of Continuity)} \qquad 1$$

$$(\partial v/\partial t)+(v\cdot\Delta)v = -\Delta(P/\rho)+(\mu/\rho)\Delta^2 v+f \text{ (Navier-Stokes Equation)} \qquad 2$$

The above-mentioned two equations (1, 2) can be approximated with sufficiently small convection term and viscosity term without an external force:

$$\Delta^2 P = 0 \qquad 3$$

So that the pressure can be represented using a harmonic function.

Figure 11:
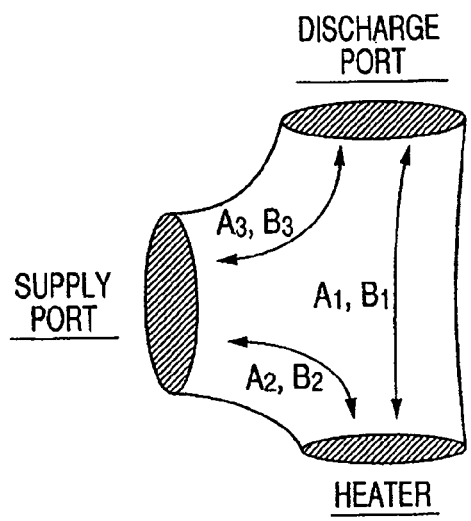
FIG. 11 is a diagram for schematically explaining the optimization of the nozzle shape design.
Figure 12:
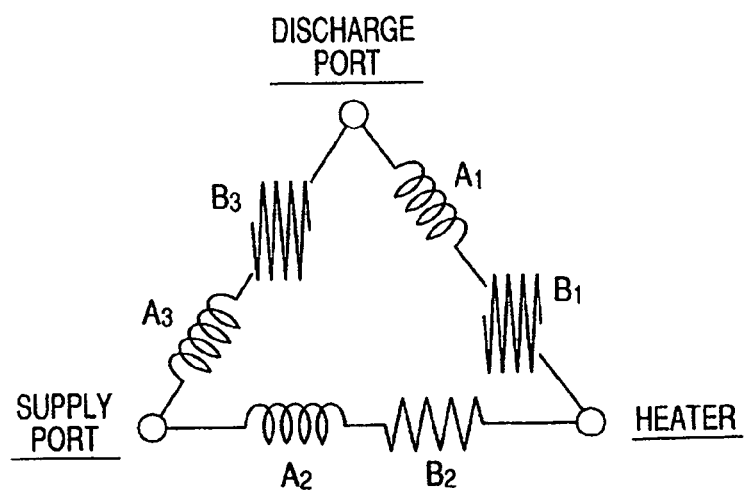
FIG. 12 is a diagram for schematically explaining the optimization of the nozzle shape design.

Then, in the case of an ink jet print head, it is described as a three port model as shown in FIG. 11, and it can be expressed by an equivalent circuit as shown in FIG. 12. The inertance is defined as the moving difficulty at the time of suddenly starting movement of a static fluid. From the viewpoint of the electricity, it functions like the inductance L that inhibits the electric current change. In the mechanical spring mass model, it corresponds to the mass (weight).

The inertance can be represented by a formula as the second time differentiation of the fluid volume V at the time a pressure difference is applied to the port, that is, the ratio of the flow rate $F(=\Delta V/\Delta t)$ with respect to the time differentiation.

$$(\Delta^2 V/\Delta t^2)=(\Delta F/\Delta t)=(1/A)\times P \qquad 4$$

Here, A is defined as. the inertance.

For example, with the assumption of a pipe type tube flow path having a density $\rho$, a length L and a cross-sectional area S0 for simulation, the inertance A0 of the pseudo one-dimensional tube flow path can be represented by:

$$A0 = \rho \times L/S0$$

It is leaned that it is proportional to the length of the first power of the flow path and inversely proportional to the first power of the cross-sectional area.

Based on the equivalent circuit shown in FIG. 12, the discharge properties of the ink jet print head can be predicted and analyzed as a model.

According to the ink jet print head of the present invention, it is found that the discharge phenomenon is the phenomenon of the transition from the inertial flow to the viscous flow. In particular, according to the bubbling initial stage in the heater portion, the inertial flow is the mainstream, and on the contrary, according to the discharge late stage (that is, the time from the meniscus withdrawal to the return of the ink to the discharge port surface by the capillary tube phenomenon), the viscous flow is the mainstream. At the time, according to the above-mentioned relational equation, at the bubbling initial stage, by the inertance amount relationship, contribution to the discharge properties, in particular, the discharge volume and the discharge rate becomes significant, and at the discharge late stage (that is, the time from the meniscus withdrawal to the return of the ink to the discharge port surface by the capillary tube phenomenon), contribution to the resistance (viscosity resistance) amount, the discharge properties, in particular, the ink refill time becomes significant.

Here, the resistance (viscosity resistance) can be described by the formula 1, and a steady stokes flow to be:

$$\Delta P = \eta \Delta^2 \mu \qquad 5$$

So that the viscosity resistance: B can be found. Moreover, at the discharge late stage, according to the model shown in FIG. 19, since the meniscus is formed in the vicinity of the discharge port so as to generate the ink flow by the force mainly by the capillary tube force, it can be approximated by a two port model (one-dimensional flow model).

That is, it can be calculated by the Poiseuille's equation 6 describing the viscous fluid.

$$(\Delta V/\Delta t)=(1/G)\times(1/\eta)((\Delta P/\Delta x)\times S(x) \qquad 6$$

Here, G: shape factor. Moreover, since the viscosity resistance: B is derived from a fluid flowing according to an optional pressure difference, it can be calculated by:

$$B = S_0^L\{(G\times\eta)/S(x)\}\Delta x \qquad 7$$

From the above-mentioned formula 7, with the assumption of a pipe type tube flow path having a density $\rho$, a length L and a cross-sectional area S0, the resistance (viscosity resistance) is:

$$B = 8\eta \times L/(\pi \times S0^2)$$

So that it is leaned that it is approximately proportional to the nozzle length of the first power of the flow path and inversely proportional to the second power of the cross-sectional area.

Accordingly, in order to improve the discharge properties of the ink jet print head, in particular, all of the discharge rate, the discharge volume and the refill time, in terms of the above-mentioned inertance, it is the necessary and sufficient condition that the inertance amount form the heater to the discharge port side is made larger as much as possible compared with the inertance amount from the heater to the supply port side as well as the resistance (viscosity resistance) in the nozzle is made smaller.

According to the recent image quality competition of the IJ printer, in order to pursue the photo image quality, realization of small liquid droplets of the ink liquid droplets is accelerated. Accompanied therewith, the orifice (discharge port diameter) of the IJ head for discharging the ink liquid droplets is made smaller as well. Therefor, the ink flow resistance at the orifice portion is made larger in proportion to the second power of the orifice diameter so that the ink liquid droplets can hardly jump from the orifice surface (in this specification, the phenomenon is referred to as the "generated first phenomenon"). Then, the present researchers have attempted to form a small liquid droplet nozzle as shown in FIG. 10 in order to stably jump the small liquid droplets out of the conventional IJ nozzle shape.

Naturally, in order to stably jump the small liquid droplets form the discharge port surface as the cross-sectional view of the IJ nozzle shown in FIG. 10, it is necessary to make the discharge port diameter smaller. According to the method disclosed in the Japanese Patent Application Laid-Open No. 2004-46217, it is known that the purpose of making the inertance amount from the heater to the discharge port side compared with the inertance amount from the heater to the supply port side can be achieved by providing the grade difference in the lower part shape of the discharge port. However, it is revealed that the resistance: B of the entire nozzle contributes significantly as a factor of influencing the refill time out of the discharge properties of the ink jet print head.

Here, in order to improve the discharge properties of the ink jet print head, in particular, all of the discharge rate, the discharge volume and the refill time, it is necessary to have the discharge port lower part shape as a two stage shape as shown in FIG. 10, and furthermore, to have the flow path height thicker so as to have the above-mentioned resistance smaller.

Then, in order to thicken the flow path height, it is important to form a desired pattern with a good yield by forming the film thickness of the lower layer side resist thickly at the time of forming the two layer resist.

According to the production of the IJ head as shown in FIG. 10 by the tow layer resist production method disclosed in the Japanese Patent Application Laid-Open No. 2004-46217, a thermally cross linkable type positive type resist material for carrying out the inter molecular cross linking is adopted as the lower layer mold material. According to the thermally cross linkable type resist material, a firm film formation is carried out by the inter molecular cross linking by applying a high temperature process after formation of the coating film by spin coating, or the like. Therefor, even though it is not so remarkable in the case of having a relatively thin film thickness, at the time of forming a 10 µm or more film thickness, the below-mentioned problems are generated.

(1) Since the molecule mesh like structure is obtained by the inter molecular cross linking of the coating film by carrying out the high temperature process (180° C. or more), the properties as the ionizing beam decomposing type resist become dull so that the light irradiation amount (exposure amount) at the time of forming the pattern is increased so as to lower the productivity.
(2) Since the thermally cross linkable film has the molecules coupled on the mesh, there are points whereat the decomposition by the light irradiation can easily be generated and points whereat the it can hardly be generated so that crack, or the like can often be generated depending on the pattern shape.
(3) The above-mentioned mold forming member is for completing a nozzle for the ink jet head by the processes of applying a nozzle forming member so as to form a discharge port, or the like, and then removing the mold forming member via the nozzle forming member. Therefore, it is found out that in the case a thermally cross linkable film is adopted for the thick film mold forming material, problems such as the light irradiation amount increase in the above-mentioned removing process or the residue in the removing process with a chemical liquid, or the like are generated.
(4) As mentioned above, in a thermally cross linkable film, since the inter molecular mesh like network formation is caused partially, the solubility by a solvent tends to be promoted at the points whereat the inter molecular cross linking is not sufficient. As a result, a phenomenon of having the flow path shape in a distorted shape can be generated.

Then, it is desired to use the mold material forming member without thermal cross linking, however, if the thermally cross linkable films disclosed in the Japanese Patent Application Laid-Open No. 2004-46217 or the Japanese Patent Application Laid-Open No. 2003-25595 are formed only by a low temperature process (less than 180° C.) without thermal cross linking, since the network on the mesh among the molecules by the inter molecular cross linking cannot be formed, the solubility resistance with respect to a solvent, such as a developing agent is lowered so that a pattern having a purposed film thickness cannot be left.

Then, as a result of the elaborate discussion of the present inventors, a configuration of forming the nozzle for the IJ head as shown in FIG. 10 accurately and inexpensively (with a good yield), capable of corresponding to a desired film thickness without thermally cross linking the mold material was found out.

That is, the above-mentioned problems are solved by using a ponopolymer with a methyl isopropenyl ketone as the main component for a positive type photosensitive resin composition for forming a first positive type photosensitive material layer to be the lower layer (hereinafter, it is referred to simply as the PMIPK), and using one as a copolymer of an ester methacrylate and a methacrylic acid, or a copolymer of an ester methacrylate and a methacrylic anhydride as the resin component for a positive type photosensitive resin composition for forming a second positive type photosensitive material layer (hereinafter, they are referred to as the PMMA based copolymers as the general term).

The methacrylic acid/ester methacrylate copolymer used in the present invention is a copolymer obtained by the radical polymerization of a methacrylic acid and an ester methacrylate, including a unit (B) obtained from a methacrylic acid and a unit (A) obtained from an ester methacrylate shown below. The polymerization ratio of the unit (B) with respect to the entire copolymer can be selected preferably from 5 to 30% by mass, and more preferably from 8 to 12% by mass.

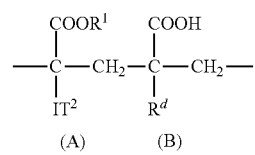

$R^2$ in the ester methacrylate component represents an alkyl group having 1 to 3 carbon atoms, and $R^1$ shows an alkyl group having 1 to 3 carbon atoms. Moreover, $R^3$ in the methacrylic acid component shows an alkyl group having 1 to 3 carbon atoms. Moreover, $R^1$ to $R^3$ have the above-mentioned meanings independently per each unit. That is, a large number of the units (A) may have the same $R^1$ or the same $R^2$, or a large number of the units (A) may include the combinations having at least one of $R^1$ and $R^2$ differently. The same is applied to the unit (B). The copolymer comprises the above-mentioned (A) and (B) units, and its polymerization form is not particularly limited as long as the properties of a desired positive type resist can be obtained by the random copolymerization, the block copolymerization, or the like. Furthermore, it is preferable that the copolymer has a 50,000 to 300,000 molecular weight (weight average), and the dispersity (Mw/Mn) in a range of 1.2 to 4.0.

The absorbing wavelength range for decomposition of the resin component of the photosensitive resin composition is preferably only 200 to 250 nm. Moreover, for the development after the light irradiation, a solution mixture of a diethylene glycol, a morpholin, a monoethanol amine and pure water, or the like can be used.

On the other hand, the methacrylic anhydride/ester methacrylate copolymer used in the present invention is a copolymer obtained by the copolymerization of a methacrylic anhydride and an ester methacrylate shown below.

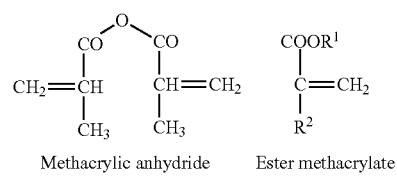

Methacrylic anhydride      Ester methacrylate

The weight ratio of the methacrylic anhydride in the copolymer with respect to the total amount of the methacrylic anhydride and the ester methacrylate can be selected preferably from 3 to 30% by mass, and more preferably from 8 to 12% by mass.

$R^2$ in the ester methacrylate component represents an alkyl group having 1 to 3 carbon atoms, and $R^1$ shows an alkyl group having 1 to 3 carbon atoms. Moreover, $R^1$ to $R^2$ have the above-mentioned meanings independently per each unit. That is, at least one kind of the ester methacrylates represented by the above-mentioned formulae can be copolymerized with a methacrylic anhydride. The copolymer can be obtained form the above-mentioned monomer components, and its polymerization form is not particularly limited as long as the properties of a desired positive type resist can be obtained by the random copolymerization, the block copolymerization, or the like. Therefore, the copolymer has the structure units shown by the following general formulae 1 and 2:

General Formula 1:

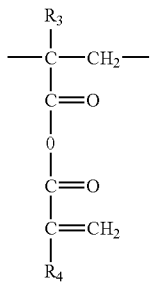

General Formula 2:

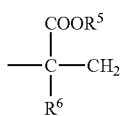

(In the general formulae 1 and 2, $R^3$ to $R^6$ show each independently a hydrogen atom, or an alkyl group having 1 to 3 carbon atoms. Moreover, $R^3$ to $R^6$ have the above-mentioned meaning independently per each unit.)

Furthermore, as the copolymer, those having a 10,000 to 100,000 molecular weight (weight average), and the dispersity (Mw/Mn) in a range of 1.2 to 5.0 are preferable.

The absorbing wavelength range for decomposition of the resin component of the photosensitive resin composition is preferably only 200 to 260 nm. Moreover, for the development after the light irradiation, a solution mixture of a diethylene glycol, a morpholin, a monoethanol amine and pure water, or the like can be used.

As to the copolymers, a polymer having the excellent solvent resistance can be synthesized without deteriorating the sensitivity for generating the photo decay by radically polymerizing a methyl methacrylate (MMA) and a methacrylic acid (MAA), or a methyl methacrylate (MMA) and a methacrylic anhydride (MAN) by a predetermined ratio, using a AIBN, or the like as the polymerization initiator, and controlling the molecular weight and the dispersity to the optimum value. Therefor, it can be used particularly preferably in the present invention without generating the trouble of dissolution, deformation, or the like at the time of applying a liquid flow path forming material to be described later.

Figure 3:
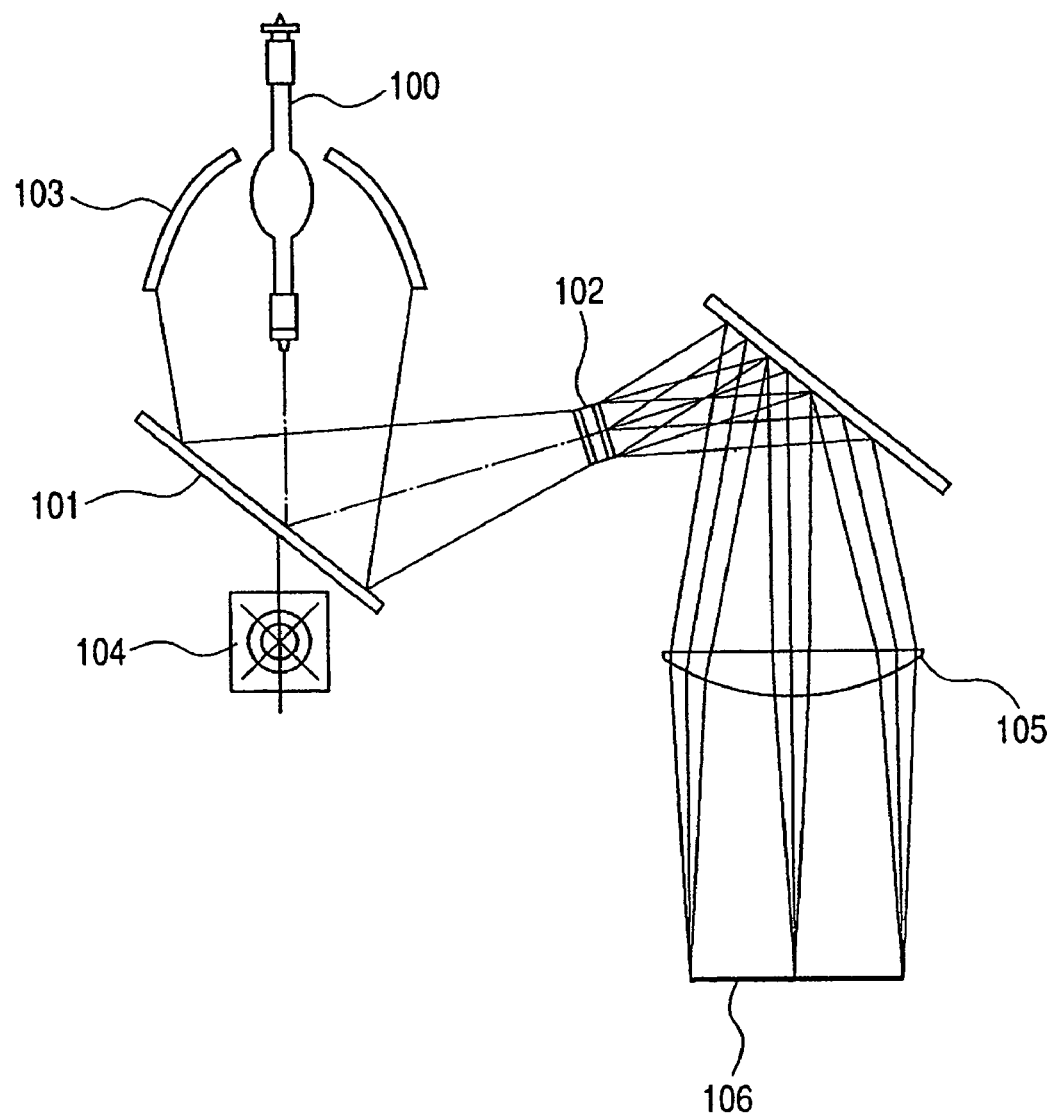
FIG. 3 is a schematic diagram of an optical system of a commonly used exposing device.

Moreover, since the PMMA based copolymer has a narrow sensitizing region of 200 to 260 nm, and furthermore, the wavelength distribution of the exposing machine shown in FIG. 3 has the integrated value of the region of about 1/10 compared with the integrated exposing amount at 270 to 330 nm, it has only the sensitizing property of about 1/3 relatively compared with the sensitivity of the PMIPK. Therefore, if the two layers are exposed at the same time after the formation of the two layers, due to the poor sensitivity of the upper layer (PMMA based copolymer), a shape with the bulky upper side is provided, and furthermore, it is difficult to accurately form the lower layer pattern to be controlled. Therefore, as the configuration of the present invention, the material configuration of the two layers (lower layer: PMIPK, upper layer: PMMA based copolymer) is important, and at the same time, the process of carrying out the exposing and developing processes by the order from the upper layer to the lower layer, using an exposing machine with the wavelength selection for each. In the case the order is changed, a desired liquid flow path shape cannot be formed.

Furthermore, if the process of applying a mold member material to be the upper layer is carried out after patterning the lowermost layer formed on the substrate firstly, the upper layer surface follows the lower layer shape so as to have a wavy shape without being flattened, and furthermore, the shape is uneven in the wafer. Therefore, it is difficult to form a desired mold material height evenly.

From these results, the process of the present invention (process flow) is optimum for forming a flow path shape of the desired ink jet recording head stably and accurately.

On the other hand, as the hardening composition having a negative type photosensitive property as a nozzle forming material, those having the properties as a member for forming a liquid flow path wall or a discharge port, and the resistance as the liquid flow path forming mold material with respect to the process of dissolving and removing the positive type resist, or the like may be used, and a photo setting composition including a cationically polymerizable chemical compound, cationic photopolymerization initiator, and a cationic polymerization inhibitor can be used. As the cationically polymerizable chemical compound to be included in the photo setting composition, those capable of having the compounds coupled with each other, utilizing the cationic addition polymerization reaction can be used. For example, as shown in the Japanese Patent Application Laid-Open No. 3-143307 (corresponding to U.S. Pat. No. 5,478,606), epoxy compounds, which are solid at ordinary temperature can be preferably used. For example, those having at least about 900 molecular weight out of the reaction products of a bisphenol A and an epichlorohydrin, a reaction product of a phenol A including a bromoth, and an epichlorohydrin, a phenol novolak, a reaction products of an o-cresol novolak and epichlorohydrin, the polyfunctional epoxy resins having an oxycyclohexane skeleton disclosed in Japanese Patent Application Laid-Open Nos. S60-161973, S62-221121, S64-9216, and H02-140219, or the like can be presented. They can be used by one kind or two or more kinds. Moreover, according to these epoxy compounds, a compound preferably having a 2,000 or less epoxy equivalent, and more preferably having a 1,000 or less epoxy equivalent can be used preferably. If the epoxy equivalent is more than 2,000, the cross linking density is lowered at the time of the hardening reaction so that Tg or the thermal deformation temperature of the hardened product is lowered, or a problem may be generated in terms of the adhesion property and the ink resistance property.

As the cationic photopolymerization initiator, an aromatic iodonium salt, an aromatic sulfonium salt [see J. POLYMER SCI: Symposium No. 56383-395 (1976)], and SP-150, SP-170, or the like, commercially available by Asahi Denka Co., Ltd., can be presented. Moreover, the cationic photopolymerization initiator can promote the cationic addition polymerization reaction by using a reducing agent in a combination and heating (the cross linking density is improved compared with the single cationic photopolymerization). However, in the case of using a cationic photopolymerization initiator and a reducing agent in a combination, it is necessary to select the reducing agent so as to provide a so-called redox type initiator system not to be reacted at an ordinary temperature but to be reacted at a certain temperature or more (preferably 60° C. or more). As such a reducing agent, a copper compound, particularly in consideration with the reactivity and solubility to an epoxy resin, a copper triflate (trifluoromethane copper sulfonate (II)) is optimum. Moreover, a reducing agent such as an ascorbic acid is also effective. Moreover, in the case a higher cross linking density (high Tg) such as increase of the number of the nozzles (high speed printing property), and use of a non neutral ink (improvement of the water resistance of the coloring agent) is necessary, the cross linking density can be raised by the post process of soaking and heating the coating resin layer, using the above-mentioned reducing agent in a form of a solution after the developing process of the above-mentioned coating resin layer to be described later.

As needed, an additive, or the like can be added optionally to the photo setting type composition. For example, addition of a flexibility providing agent for the purpose of lowering the elastic modulus of an epoxy resin, addition of a silane coupling agent for the purpose of obtaining the further adhesion force with respect to the substrate, or the like can be presented.

After hardening the portions other than the portion with the light blocking by the pattern exposure of the negative type resist layer via a mask for blocking the light beam to the portion for providing the discharge port, it is processed with a developing solution so as to remove the light blocking portion for forming the discharge port. For the pattern exposure, any type of the commonly used exposing devices may be applied. It is preferably an exposing device for directing a wavelength range coinciding with the absorbing wavelength range of the negative type resist layer and not coinciding with the absorbing wavelength range of the positive type resist layer. Moreover, it is preferable to carry out the development after the pattern exposure to the negative type resist layer with an aromatic solvent, such as a xylene.

In the present invention, it is preferable to form the first positive type photosensitive material layer by forming a first positive type photosensitive material layer by a solvent coating method, vaporizing the coating solvent in the layer by heating, coating a material for forming the second positive type photosensitive material layer, and vaporizing the coating solvent by applying the heat to the formed coating layer. Moreover, it is preferable that the glycol ether included in the developing agent of the second positive type photosensitive material layer is at least one kind selected from the group consisting of an ethylene glycol monobutyl ether and a diethylene glycol monobutyl ether. On the other hand, it is preferable that the nitrogen containing basic organic solvent included in the developing agent of the second positive type photosensitive material layer is at least one kind selected from the group consisting of an ethanol amine and a morpholin. Furthermore, it is preferable that the first wavelength range for sensitizing the first positive type photosensitive material is a range of 270 nm to 350 nm, and the second wavelength range for sensitizing the second positive type photosensitive material is a range of 230 nm to 260 nm.

For the liquid discharge head according to the present invention, those having a configuration with the liquid flow path height provided relatively lower at a point adjacent to the bubble generating chamber on the liquid discharge energy generating element, and those having a configuration with a dust scavenging pillar like member formed with the material comprising the liquid flow path provided in the liquid flow path without reaching to the substrate, are preferable. Moreover, those having a configuration with liquid supply ports connected commonly with each liquid flow path formed in the substrate such that the liquid flow path height at the central part of the liquid supply port is lower than the liquid flow path height at the opening rim part of the liquid supply port are preferable. Moreover, those having a configuration with the cross-sectional shape of the bubble generating chamber on the liquid discharge energy generating element of a convex shape are also preferable.

Next, the present invention will be explained in detail. According to the production of the liquid discharge head by the present invention, it is advantageous in that the distance between the discharge energy generating element (such as a heater) and the orifice (discharge port) and the positioning accuracy of the element and the orifice center, as the one of the most important factors which influences the properties of the liquid discharge head can be set extremely easily, or the like. That is, according to the present invention, by controlling the coating film thickness of the photosensitive material layer by two times, the distance between the discharge energy generating element and the orifice can be set, and the coating film thickness of the photosensitive material layer can be controlled strictly with a good reproductivity by the thin film coating technique, which has conventionally been used. Moreover, for the positioning of the discharge energy generating element and the orifice, optical positioning by the photolithography process can be enabled so that positioning can be carried out with a dramatic high accuracy compared with the method of bonding the liquid flow path structure plate onto the substrate, which has conventionally been used for the production of the liquid discharge recording head.

Moreover, as the dissovable resist layer, a polymethyl isopropenyl ketone (PMIPK) is known. These positive type resists are a resist, which has the absorption peak in the vicinity of the 290 nm wavelength so that the two layer structure ink liquid flow path mold can be formed by the combination with a resist having a photosensitive wavelength range, which is different from that of the resist.

On the other hand, a polymer compound comprising a copolymer of an ester methacrylate such as a polymethyl methacrylate (PMMA) and a methacrylic acid as one of the ionizing radiation decomposing type resists is a positive type resist having the sensitivity at the 250 nm or less sensitive wavelength range. By applying the above-mentioned resist (PMMA based copolymer) onto the above-mentioned resist (PMIPK), exposing the same by a 230 to 260 nm band exposing wavelength range, and developing the same with a GG-Developer (a liquid mixture of a diethylene glycol, a morpholin, a monoethanol amine and pure water) as the alkaline developing solution, a PMMA based copolymer pattern can be formed onto the PMIPK film. Then, by exposing the above-mentioned resist (PMIPK) by a 270 to 330 nm band exposing wavelength range, and developing the same with a MIBK, or the like as the organic solvent, a two layer ink liquid flow path mold can be formed.

In the following, the process flow for forming the ink liquid flow path according to the production method of the present invention will be explained with reference to FIGS. 1A to 1F and 2.

FIGS. 1A to 1F show a process flow for forming a mold for an ink flow path as a minute structure in the present invention, and FIGS. 2A to 2H show a nozzle forming process for an ink jet print head of the present invention.

Figure 1A:
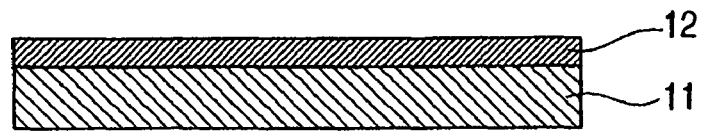
FIGS. 1A, 1B, 1C, 1D, 1E and 1F are explanatory diagrams each for explaining a basic process flow of a production method of the present invention.
Figure 1B:
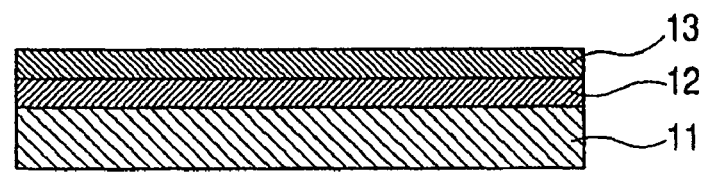

First, FIGS. 1A to 1F will be explained. As shown in FIG. 1A, a positive type resist layer 12 including a PMIPK is formed on a substrate 11. A coating type resist having the PMIPK as the main component is commercially available from Tokyo Ouka Kogyo Co., Ltd. as the product name: ODUR-1010. The coating film can be formed by a commonly used spin coat method. Next, as shown in FIG. 1B, a positive type resist layer 13 (PMMA) including a PMMA based copolymer is formed on the positive type resist layer 12 (ODUR) by the spin coat method.

Figure 1C:
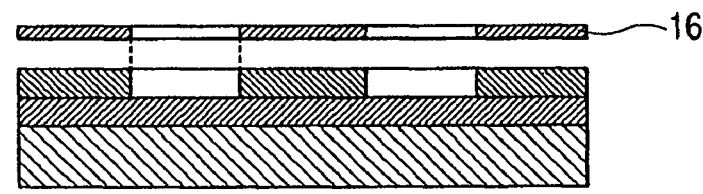

Furthermore, as shown in FIG. 1C, the positive type resist layer 13 (PMMA) including the PMMA based copolymer is exposed. For the positive type resist layer (PMMA), a photo mask 16 for removing the exposed point is adopted. At the time, by using a 230 to 260 nm band exposing wavelength range, the lower layer positive type resist can barely be sensitized. This is derived from the fact that the absorption of the ketone allows transmission of a 230 to 260 nm light beam mostly, deriving from the carbonyl group so as not to be sensitized. By developing the exposed positive type resist layer (PMMA) with a liquid mixture of a diethylene glycol, a morpholin, a monoethanol amine and pure water, a predetermined pattern is obtained. The above-mentioned developing solution is alkaline. According to the developing solution, the dissolving rate of the acrylic based resist in the unexposed portion is extremely low, and furthermore, the influence to the lower layer can only be slight at the time of developing the upper layer.

Figure 1D:
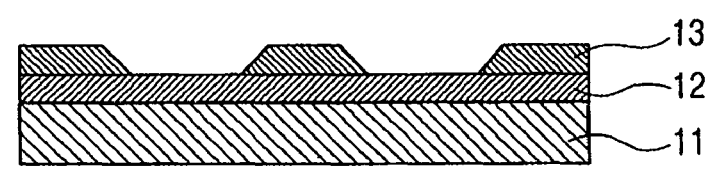
Figure 1E:
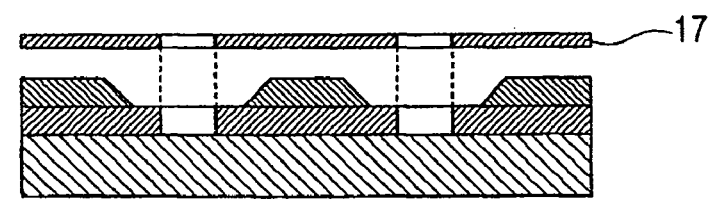

Then, as shown in FIG. 1D, by carrying out the post baking process including the substrate 11 at 100 to 130° C. for 3 minutes, an inclination of about 10° can be provided to the side wall of the upper layer positive type resist. Then, as shown in FIG. 1E, the positive type resist layer 12 (ODUR) including the PMIPK is exposed. For the positive type resist layer (ODUR), a photo mask 17 for removing the exposed point is adopted. At the time, by using a 270 to 330 nm band exposing wavelength range, the lower layer positive type resist can be sensitized. Moreover, since the 270 to 330 nm range exposing wavelength transmits the upper layer positive type resist, it can hardly be influenced by the light beam coming around the mask or the reflected light beam from the substrate.

Figure 1F:
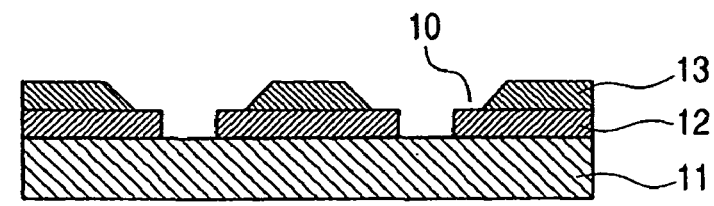

Then, as shown in FIG. 1F, by developing the exposed lower layer positive type resist layer 12 (ODUR), a predetermined pattern is obtained. It is preferable to use a methyl isobutyl ketone as the organic solvent for the developing solution. Since the unexposed PMMA based copolymer is hardly dissolved by the developing solution, the upper layer pattern cannot be changed at the time of developing the lower layer resist.

Figure 2A:
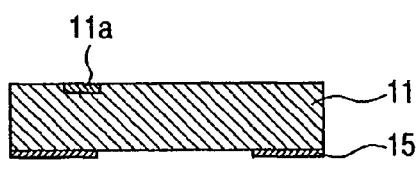
FIGS. 2A, 2B, 2C, 2D, 2E, 2F, 2G and 2H are diagrams showing a process for manufacturing an ink jet head including the processes of FIGS. 1A to 1F.

Next, with reference to FIGS. 2A to 2H, the method for manufacturing a liquid discharge head of the present invention will be explained. In FIG. 2A, as the substrate 11, a silicon is used. That is, since the driver, the logic circuit, or the like for controlling the discharge energy generating element 11a are manufactured by a commonly used semiconductor production method, it is preferable to use a silicon for the substrate. Moreover, as a method for forming a through hole for supplying an ink to the substrate, it is also possible to use a technique such as a YAG laser and sand blasting. However, it is preferable that a through hole is not formed the substrate at the time of applying a resist. As such a method, a silicon anisotropic etching technique by an alkaline solution can be used. In this case, a mask pattern may be formed on the substrate rear surface with an alkaline resistant silicon nitride, or the like, and a membrane film to be the etching stopper may be formed on the substrate front surface with the same material.

Figure 2B:
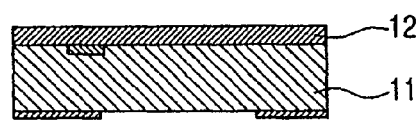
Figure 2C:
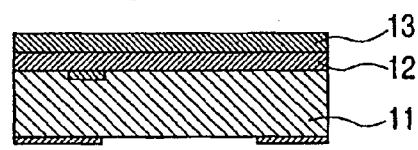
Figure 2D:
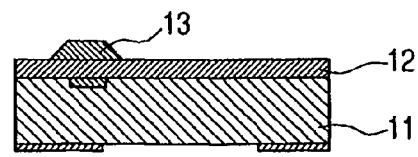

Next, as shown in FIG. 2B, a positive type resist layer 12 (ODUR) including a PMIPK is formed on the substrate. The coating film can be formed by a commonly used spin coating method. Next, as shown in FIG. 2C, a positive type resist layer 13 (PMMA) including a PMMA based copolymer is formed on the positive type resist layer 12 (ODUR) by the spin coating method. Next, in order to obtain the structure shown in FIG. 2D, the positive type resist layer 13 (PMMA) including the PMMA based copolymer is exposed. For the positive type resist layer (PMMA), a photo mask (not shown) for removing the exposed point is adopted. the time, by using a 23 p to 260 nm band exposing wavelength range, the lower layer positive type resist can barely be sensitized. This is derived from the fact that the absorption of the ketone allows transmission of a 230 to 260 nm light beam mostly, deriving from the carbonyl group so as not to be sensitized. By developing the exposed positive type resist layer (PMMA) with a liquid mixture of a diethylene glycol, a morpholin, a monoethanol amine and pure water, a predetermined pattern is obtained. The above-mentioned developing solution is alkaline. According to the developing solution, the dissolving rate of the acrylic based resist in the unexposed portion is extremely low, and furthermore, the influence to the lower layer can only be slight at the time of developing the upper layer.

Figure 2E:
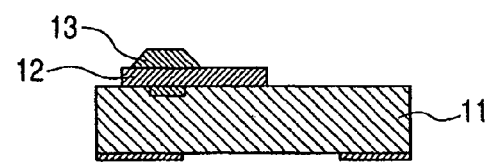

Then, in order to obtain the structure shown in FIG. 2E, the positive type resist layer 12 (ODUR) including the PMIPK is exposed. For the positive type resist layer (PDUR), a photo mask for removing the exposed point is adopted. At the time, by using a 270 to 330 nm band exposing wavelength range, the lower layer positive type resist can be sensitized. Moreover, since the 270 to 330 nm range exposing wavelength transmits the upper layer positive type resist, it can hardly be influenced by the light beam coming around the mask or the reflected light beam from the substrate. Thereafter, by developing the exposed lower layer positive type resist layer (ODUR), a predetermined pattern is obtained. It is preferable to use a methyl isobutyl ketone as the organic solvent for the developing solution. Since the unexposed PMMA based copolymer is hardly dissolved by the developing solution, the upper layer pattern cannot be changed at the time of developing the lower layer resist.

Figure 2F:
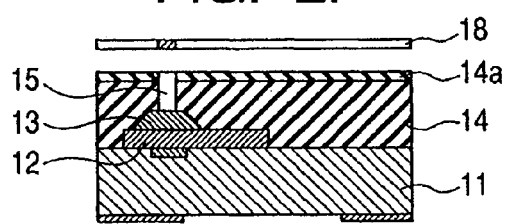

Next, as shown in FIG. 2F, a liquid flow path structure material 14 is applied so as to cover the lower layer positive type resist layer 12 and the upper layer positive type resist layer 13, a coating resin layer is provided. For the applying operation, a commonly used solvent coating method such as spin coating can be used. As it is shown in the U.S. Pat. No. 3,143,307, the liquid flow path structure material is a material including as the main component an epoxy resin to be solid at an ordinary temperature and an onium salt generating a cation by the light irradiation, which has the negative type properties. Moreover, in the case of forming a water-repellent material layer 14a on the liquid flow path structure material layer, as it is mentioned in Japanese Patent Application Laid-Open No. 2000-326515, it can be carried out by forming a photosensitive water-repellent material layer, and exposing and developing the same collectively. At the time, the photosensitive water-repellent material layer can be formed by lamination. Thereafter, the liquid flow path structure material and the photosensitive water-repellent material layer are exposed at the same time. Since the liquid flow path structure material 14 of the negative type properties is used in general, a photo mask 18 for preventing the light irradiation to the portion to be the discharge port is used. Then, by developing the coating resin layer of the liquid flow path structure material, a discharge port 15 is formed. It is preferable to use an aromatic solvent such as a xylene for the development.

Figure 2G:
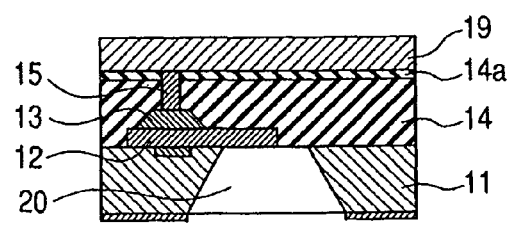

Next, as shown in FIG. 2G, a cyclized isoprene 19 is applied on the liquid flow path structure material layer for protecting the material from the alkaline solution. As the material, one commercially available under the name of OBC from the Tokyo Ouka Kogyo Co., Ltd. was used. Thereafter, by soaking the silicon substrate in a 22 wt % solution of a tetramethyl ammonium hydride (TMAH) at 83° C. for 13 hours, a through hole 20 for the ink supply was formed. Moreover, a silicon nitride used as a mask and a membrane for the ink supply port formation is preliminarily patterned on the silicon substrate.

Figure 2H:
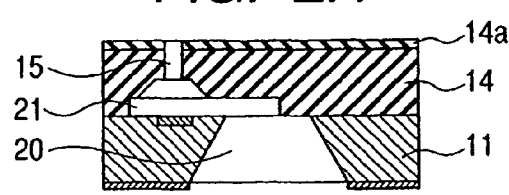

Next, as shown in FIG. 2H, with the silicon substrate mounted in a dry etching device with the rear surface disposed upward after the anisotropic etching, the membrane film was removed by an etchant with oxygen mixed by 5% in CF4. Then, by soaking the above-mentioned silicon substrate in a xylene, the OBC was removed. Thereafter, by the entire surface exposure, the positive type resist layers 12, 13 as the liquid flow path mold materials are decomposed. By directing a light beam of a 330 nm or less wavelength, the upper layer and lower layer resist materials are decomposed to a low molecular compound so as to be easily removed by a solvent.

Finally, the positive type resist layer as the liquid flow path mold material is removed by a solvent. According to the process, as shown in the cross-sectional view of FIG. 2H, a liquid flow path 21 communicating with the discharge port 15 can be formed. The liquid flow path 21 of the present invention has a shape with the liquid flow path height lower in the vicinity of the discharge chamber as a bubble generating chamber, forming a part of the liquid flow path and in contact with a heater (liquid discharge energy generating part). By applying the vibration of an ultrasonic wave, a mega sonic, or the like, in the mold material removing process with a solvent, the dissolving and removing time can be made shorter.

Here, in FIG. 3, a schematic diagram of the optical system of a proximity exposing device used as a commonly used exposing device is shown. It has a configuration of reflecting an ultraviolet ray or a far ultraviolet ray generated from a high pressure mercury lamp (2.0 kW, Xe—Hg lamp) 100 to a screen 104 by a reflected light collecting device 100, selecting a light beam of a desired wavelength by a cold mirror 101 for reflecting only the light beam of a wavelength necessary for the resist exposure, enlarging and evening with a fly eye lens 102, and directing the light beam to a resist (not shown) via a condenser lens 105, a projection optical system and a mask 106. In the case all the light beams are reflected, the light beams of a wavelength unnecessary for the sensitization of the resist are converted to heat so as to prevent the deterioration of the patterning accuracy. According to a mask aligner UX-3000SC manufactured by Ushio Inc., a cut filter for blocking the light beams of the wavelengths other than desired one is provided automatically detachably between the above-mentioned fly eye lens 102 and the cold mirror. Accordingly, by exposing and patterning the two kinds of the different resists, using the exposing wavelengths of two kinds of the different wavelength ranges, an ink jet head having the ink liquid flow path height provided partially differently can be manufactured by the production flow shown in FIGS. 1A to 1F and 2A to 2H.

Figure 4A:
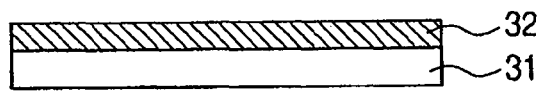
FIGS. 4A, 4B, 4C 4D, 4E, 4F and 4G are diagrams each showing a process flow in the case of using a methacrylate based resist for the upper layer in a production method of the present invention.
Figure 4B:
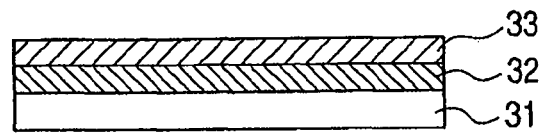
Figure 4C:
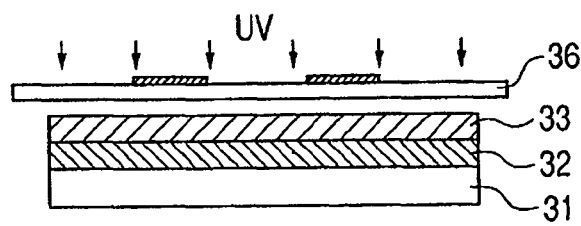

FIGS. 4A to 4G and FIGS. 5A to 5D show the most preferable process flow using the PMMA based copolymer positive type resist as the upper layer resist. FIGS. 5A to 5D shows the subsequent steps of the process shown in FIGS. 4A to 4G. In FIG. 4A, a positive type resist layer 32 including a PMIPK is applied on a substrate 31 and baked. For the application, a commonly used solvent coat method such as spin coating and bar coating can be used. Moreover, the baking temperature is preferably 100 to 150° C. Then, as shown in FIG. 4B, a photo decay type positive type resist 33 of a PMMA based copolymer is applied as the upper layer of the positive type resist layer 32 including the PMIPK and baked. For the application, commonly used solvent coat method such as spin coating and bar coating can be used. Moreover, the baking temperature is preferably 100 to 150° C. Then, as shown in FIG. 4C, the photo decay type positive type resist layer 33 of the PMMA based copolymer is exposed using an exposing wavelength of a 230 to 260 nm band. For example, by blocking the light beams of 260 nm or more using the mask aligner UX-3000SC manufactured by Ushio Inc., a desired exposing wavelength of a 230 to 260 nm band can be directed selectively.

Figure 4D:
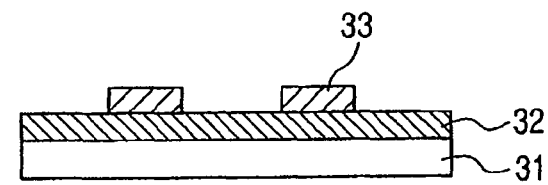

Then, as shown in FIG. 4D, the upper layer resist layer 33 is developed. As the developing solution, a solvent capable of at least dissolving the exposing part and hardly dissolving the unexposed part can be used. As a result of the elaborate discussion of the present inventors, it was found out that a developing solution containing a glycol ether having 6 or more carbon atoms to be mixed with water by an optional ratio, a nitrogen containing basic organic solvent and water can be used particularly preferably. As the glycol ether, an ethylene glycol monobutyl ether and/or diethylene glycol monobutyl ether, and as the nitrogen containing basic organic solvent, an ethanolamine and/or morpholine are particularly preferred. For example, as a developing solution for the PMMA (polymethyl methacrylate) used as a resist in the X ray lithography, a developing solution having the composition disclosed in Japanese Patent Application Laid-Open No. H03-10089 (corresponding to U.S. Pat. No. 4,393,129) can be used preferably also in the present invention. As to the composition ratio of each of the above-mentioned components, for example, a developing solution containing:
Diethylene glycol monobutyl ether 60 vol %
Ethanolamine: 5 vol %
Morpholin: 20 vol %
Ion exchange water: 15 vol %
can be used.

Figure 4E:
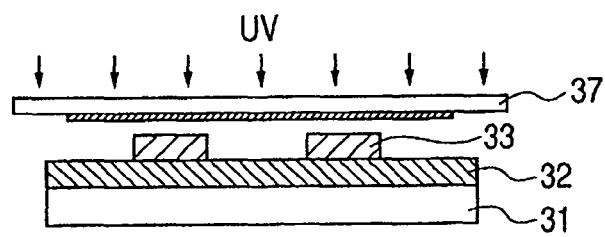

Furthermore, as shown in FIG. 4E, the lower layer positive type resist layer 32 is exposed. For the exposure, it is exposed using an exposing wavelength of a 270 to 330 nm band. For example, by blocking the light beams of 270 nm or less using the mask aligner UX-3000SC manufactured by Ushio Inc., a desired exposing wavelength of a 270 to 330 nm band can be directed selectively.

Figure 4F:
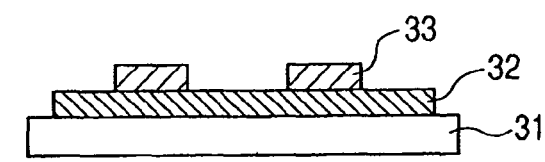
Figure 4G:
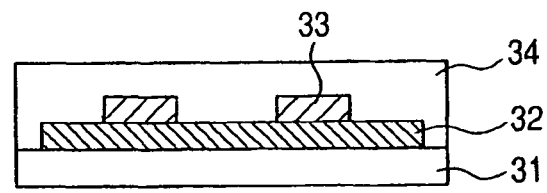

Then, as shown in FIG. 4F, the positive type resist layer 32 is developed. For the development, it is preferable to use a methyl isobutyl ketone as the developing solution for the PIMPK, however, any organic solvent capable of dissolving the exposed part of the PIMPK without dissolving the unexposed part can be used. Then, as shown in FIG. 4G, a liquid flow path structure material 34 is applied so as to cover the lower layer positive type resist layer 32 and the upper layer positive type resist layer 33. For the application, a commonly used solvent coat method such as spin coating can be used. As it is shown in the U.S. Pat. No. 3,143,307, the liquid flow path structure material is a material including as the main component an epoxy resin to be solid at an ordinary temperature and an onium salt generating a cation by the light irradiation, which has the negative type properties. FIG. 5A shows the process of carrying out the light irradiation to the liquid flow path structure material, using a photo mask 38 without directing a light beam to a portion to be the ink discharge port. Next, as shown in FIG. 5B, the pattern development of the ink discharge port 35 is carried out for the photosensitive liquid flow path structure material 34.

For the pattern exposure, any of the commonly used exposing devices can be used. It is preferable to develop the photosensitive liquid flow path structure material with an aromatic solvent not dissolving the PMIPK, such as a xylene. Moreover, in the case of forming a water-repellent material layer on the liquid flow path structure material layer, as it is mentioned in Japanese Patent Application Laid-Open No. 2000-326515, it be carried out by forming a photosensitive water-repellent material layer, and exposing and developing the same collectively. At the time, the photosensitive water-repellent material layer can be formed by lamination. Then, as shown in FIGS. 5A to 5D, an ionizing radiation of 300 nm or less is directed correctively beyond the liquid flow path structure material layer. This is for the purpose of decomposing the PMIPK and the PMMA copolymer resist so as to be a low molecule for facilitating the removal.

Finally, the positive type resists 32, 33 used for the mold are removed by a solvent. Thereby, a liquid flow path 39 including a discharge chamber is formed as shown in FIG. 5D.

By using the processed as mentioned above, the height of the ink liquid flow path from the ink supply port to the heater can be changed.

According to the production method, the height of the ink liquid flow path from the ink supply port to the heater can be changed. Optimization of the ink liquid flow path shape from the ink supply port to the discharge chamber not only relates significantly to the ink refilling rate to the discharge chamber but also enables reduction of the cross talk between the discharge chambers. The specification of the U.S. Pat. No. 4,882,595 by Trueba, et al. discloses the relationship between the two-dimensional shape, that is, the shape in the direction parallel to the substrate, of the ink liquid flow path to be formed by the photosensitive resist on the substrate and the above-mentioned properties. On the other hand, according to Japanese Patent Application Laid-Open No. H10-291317 by Mercy et al., it is disclosed that a resin liquid flow path structure plate is processed in a three-dimensional direction in the in-plane direction and the height direction with respect to the substrate by an excimer laser so as to change the height of the ink liquid flow path.

However, in the case of the process by an excimer laser, due to the expansion of the film by the heat at the time of process, or the like, a sufficient accuracy cannot be realized in most cases. In particular, the process accuracy in the depth direction of the resin film by the excimer laser is influenced by the laser irradiation distribution and the laser beam stability so that the accuracy capable of clarifying the interaction between the ink liquid flow path shape and the discharge properties cannot be ensured. Therefore, according to Japanese Patent Application Laid-Open No. H10-291317, a clear relationship between the ink liquid flow path height shape and the discharge properties is not mentioned.

According to the production method of the present invention, it is executed by a solvent coat method used as the semiconductor production technique such as spin coating, the height of the ink liquid flow path can be formed stably with an extremely high accuracy. Moreover, as to the two-dimensional shape in the direction parallel to the substrate, since the semiconductor photolithography technique is used, the sub micron accuracy can be realized.

Figure 6A:
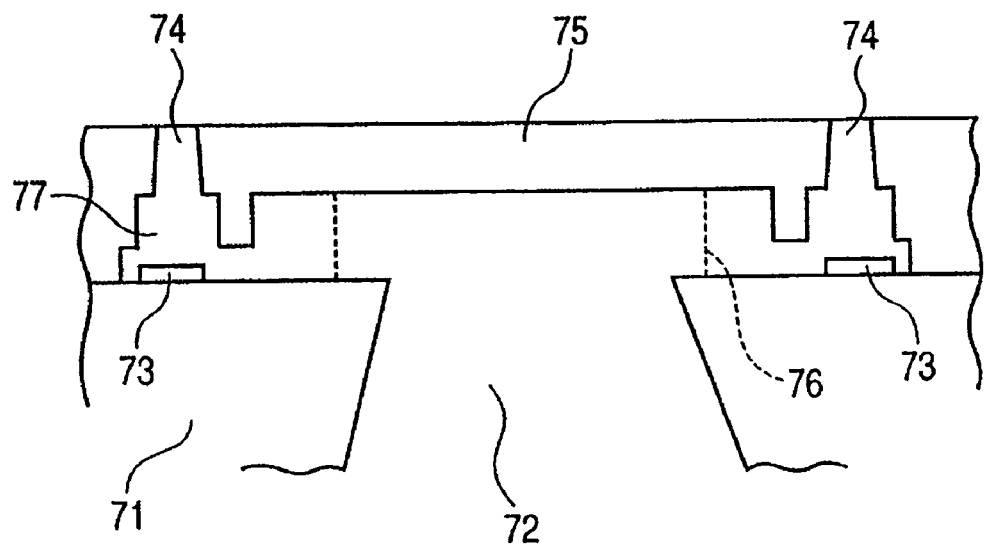
FIG. 6A is a vertical cross-sectional view showing the nozzle structure of an ink jet head with the discharge chamber improved by the production method of the present invention.
Figure 6B:
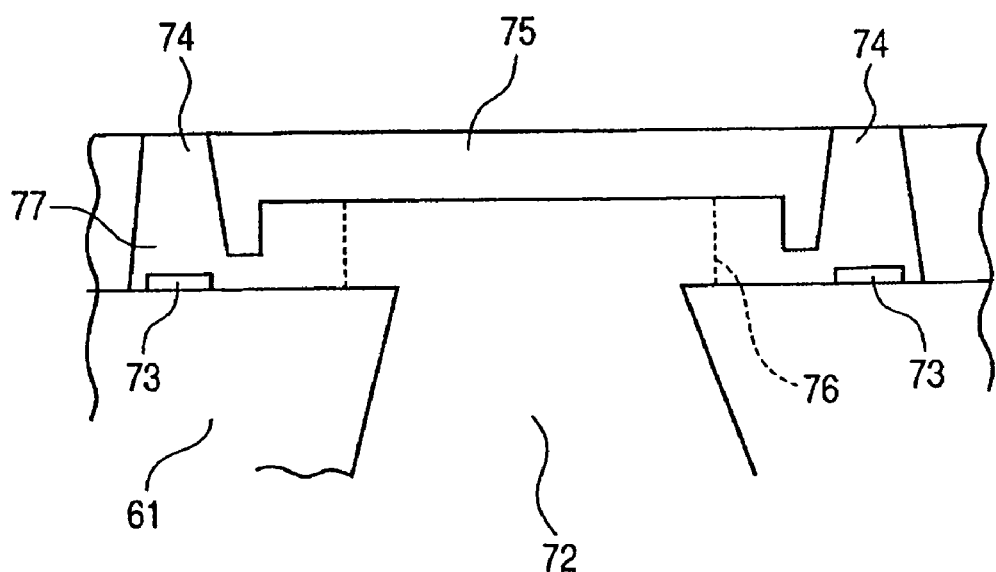
FIG. 6B is a vertical cross-sectional view showing the nozzle structure for the comparison with the head shown in FIG. 6A.

Next, the structure of an ink jet head capable of using the present invention will be explained with reference to FIGS. 6A to 6B. FIG. 6A is a vertical cross-sectional view showing the nozzle structure of an ink jet head with the discharge chamber improved by the production method of the present invention, and FIG. 6B is a vertical cross-sectional view showing the nozzle structure for the comparison with the head shown in FIG. 6A. As shown in FIG. 6A, the head using the present invention is characterized in that the discharge port shape of the discharge chamber 77 has a convex cross-sectional shape. The ink discharge energy is changed drastically by the ink flow resistance defined by the discharge port shape in the heater upper part. According to the conventional production method, since the discharge port shape is formed by patterning the liquid flow path structure material, it is a shape with the discharge port pattern formed in the mask projected thereto. Therefore, principally, the discharge port is formed through the liquid flow path structure material layer by the same area as the discharge port opening area in the liquid flow path structure material surface. However, according to the production method of the present invention, by changing the pattern shapes of the lower layer material and the upper layer material, the discharge port shape of the discharge chamber 77 can be formed in a convex shape. Thereby, the effects of making the ink discharge rate higher and increasing the straight movement property of the ink can be provided so that a recording head capable of recording with a higher image quality can be provided.

Hereinafter, with reference to the drawings as needed, the present invention will be explained in detail.

First Embodiment

Figure 7A:
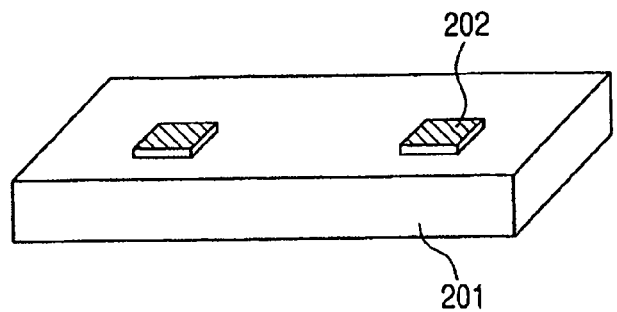
FIGS. 7A, 7B, 7C, 7D, 7E, 7F, 7G and 7H are schematic perspective views each for explaining a production method according to an embodiment of the present invention.

In each of FIGS. 7A to 7H, an example of the production procedure of a liquid discharge head according to the present invention is shown. FIG. 7I is a schematic cross-sectional view of a liquid discharge head completed by the production method shown in FIGS. 7A to 7H.

Although a liquid jetting recording head having two orifices (discharge ports) is shown in this embodiment, of course it is needless to say that the same is applied to the case of a high density multi array liquid jetting recording head having more orifices. First, in this embodiment, for example as shown in FIG. 7A, a substrate 201 made of a glass, ceramics, a plastic, a metal, or the like can be used. FIG. 7A is a schematic perspective view of the substrate before the photosensitive material layer formation. The substrate 201 functions as a part of the wall member of the liquid flow path, and as long as it can function as a supporting member for a liquid flow path structure member comprising a photosensitive material layer to be described later, it can be used without limitation of the shape, the material, or the like. On the above-mentioned substrate 201, a desired number of liquid discharge energy generating elements 202 such as an electro thermal conversion element, a piezoelectric element, or the like are disposed (an example of two pieces is shown in FIG. 7A). By providing the discharge energy for discharging recording liquid small droplets to the ink liquid by the liquid discharge energy generating elements 202, a recording operation is carried out. For example, in the case an electro thermal conversion element is used as the liquid discharge energy generating elements 202, by heating the recording liquid in the vicinity by the elements, the discharge energy is generated. Moreover, for example, in the case a piezoelectric element is used, by the mechanical vibration of the elements, the discharge energy is generated.

These elements 202 are connected with a control signal inputting electrode (not shown) for operating these elements. Moreover, although various functional layers such as a protection layer are provided in general, for the purpose of the improvement of the use endurance of these discharge energy generating elements 202, of course, also in the present invention, there is no problem to provide such a functional layer. Most commonly, a silicon is used for the substrate 201. That is, since the driver, the logic circuit, or the like for controlling the discharge energy generating element are manufactured by a commonly used semiconductor production method, it is preferable to use a silicon for the substrate. Moreover, as a method for forming a through hole for supplying ink to the substrate, it is also possible to use a technique such as a YAG laser or sand blasting. However, it is preferable that a through hole is not formed in the substrate at the time of applying a resist. As such a method, a silicon anisotropic etching technique by an alkaline solution can be used. In this case, a mask pattern may be formed on the substrate rear surface with an alkaline resistant silicon nitride, or the like, and a membrane film to be the etching stopper may be formed on the substrate front surface with the same material.

Figure 7B:
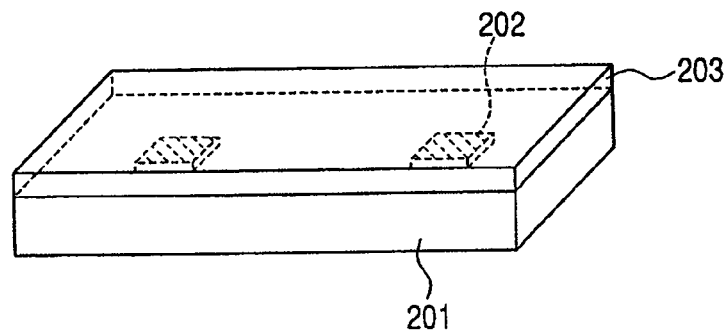

Then, as shown in FIG. 7B, a PMIPK positive type resist layer 203 is applied onto the substrate 201 including the liquid discharge energy generating elements 202. As to the PMIPK, ODUR-1010 commercially available from the Tokyo Ouka Kogyo Co., Ltd. was adjusted so as to have the resin concentration to 20 WT % and used. The pre baking operation was carried out by a hot plate at 120° C. for 3 minutes. Furthermore, in a nitrogen atmosphere, a heat treatment was carried out at 150° C. for 60 minutes in an oven. The film thickness of the coating film was 15 µm.

Figure 7C:
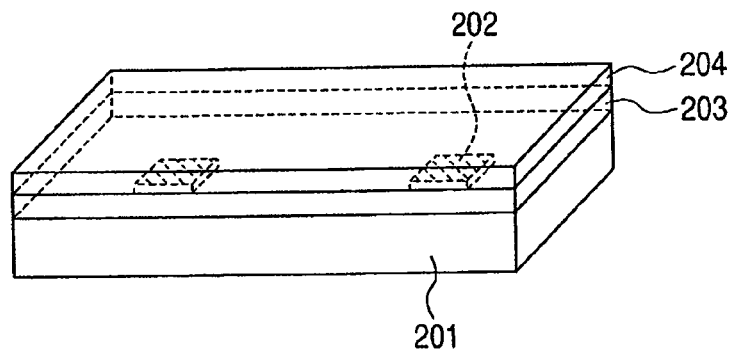

Then, as shown in FIG. 7C, a photo decay type positive type resist layer 204 of a PMMA copolymer was applied on the above-mentioned positive type resist layer 203. As the photo decay type positive type resist of a PMMA copolymer, the following positive resist was used.

Radical polymerization product of a methyl methacrylate and a methacrylic acid (PMMA based copolymer)

Weight average molecular weight (Mw: based on the polystyrene)=170,000

Dispersity (Mw/Mn)=2.3

Figure 7D:
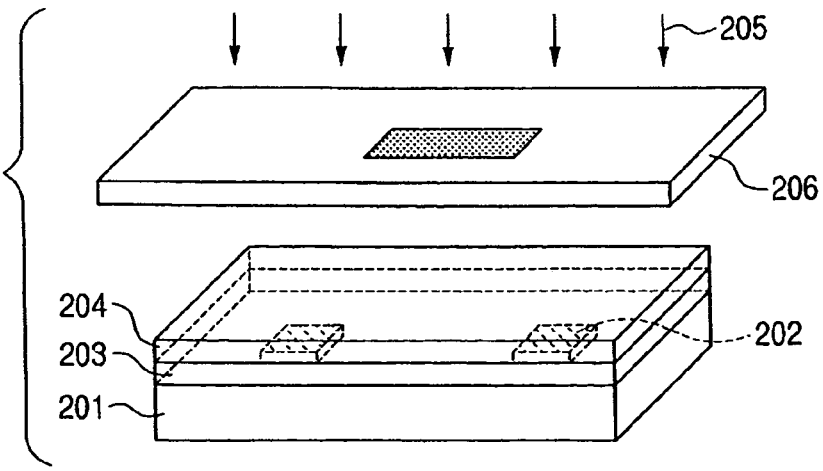

The resin powders were dissolved in a diglyme solvent by about a 25 wt % solid component concentration, and used as the resist liquid. The viscosity of the resist solution at the time was about 600 cps. After applying the resist liquid by the spin coating method and pre baking at 100° C. for 3 minutes, a heat treatment was out at 150° C. for 30 minutes in a nitrogen atmosphere by an oven. The film thickness of the resist layer after the heat treatment was 5 µm. Then, as shown in FIG. 7D, the photo decay type positive type resist layer 204 of a PMMA copolymer of a carboxylic acid was exposed. As to the exposing device, the mask aligner UX-3000SC manufactured by Ushio Inc. was used, and an exposing wavelength of a 230 to 260 nm band was directed selectively.

Figure 7E:
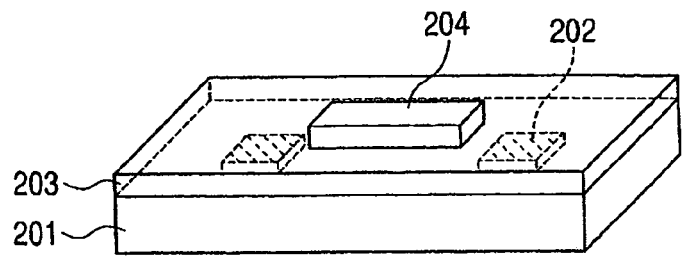

Then, as shown in FIG. 7E, the photo decay type positive type resist layer 204 of a PMMA copolymer was developed. For the development, by developing the same with a developing solution of the following composition, a desired pattern was formed.

Developing solution

Diethylene glycol monobutyl ether: 60 vol %

Ethanol amine: 5 vol %

Morpholin: 20 vol %

Ion exchange water: 15 vol %

Figure 7F:
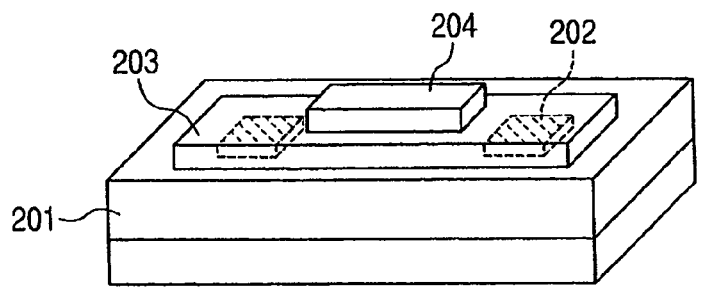

Then, as shown in FIG. 7F, the lower layer PMIPK positive type resist layer 203 was patterned (exposure, development). As the exposing device, the same device was used, and using a cut filter, a 270 to 330 nm band exposing wavelength was directed selectively. The development was carried out with a methyl isobutyl ketone.

Figure 7G:
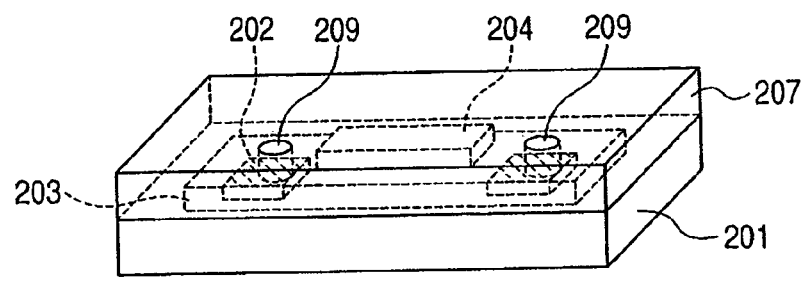

Then, as shown in FIG. 7G, a liquid flow path structure material 207 layer was formed so as to cover the patterned lower layer positive type resist layer 203 and the upper layer positive type resist layer 204. The layer material was manufactured by dissolving 50 parts of EHPE-3150 commercially available from Daicel Chemical Industries, Ltd., 1 part of a photo cationic polymerization initiator SP-172 commercially available from Asahi Denka Co., Ltd., and 2.5 parts of a silane coupling material A-187 commercially available from Nihonunica Corporation in 50 parts of a xylene used as a coating solvent. The coating operation was carried out by spin coating, and the pre baking operation was carried out on a hot plate at 90° C. for 3 minutes. For the exposure, a mask aligner MPA-600FA manufactured by Canon was used, and the exposure was carried out by 3 J/cm2. The development was carried out by soaking the same in a xylene for 60 seconds. Thereafter, by baking at 100° C. for 1 hour, the adhesion of the liquid flow path structure material was improved.

Then, pattern exposure and development of the ink discharge port 209 is carried out for the liquid flow path structure material 207. For the pattern exposure, any of the commonly used exposing devices can be used. Although it is not shown in the figure, a mask for preventing the light irradiation was used for a portion to be the ink discharge port at the time of the exposure. Thereafter, although it is not shown in the figure, a cyclized isoprene was applied on the liquid flow path structure material layer for protecting the material from the alkaline solution. As the material, one commercially available under the name of OBC from the Tokyo Ouka Kogyo Co., Ltd. was used. Thereafter, by soaking the silicon substrate in a 22 wt % solution of a tetramethyl ammonium hydride (TMAH) at 83° C. for 13 hours, a through hole (not shown) for the ink supply was formed. Moreover, a silicon nitride used as a mask and a membrane for the ink supply port formation is preliminarily patterned on the silicon substrate. With the silicon substrate mounted in a dry etching device with the rear side disposed upward after the anisotropic etching, the membrane film was removed by an etchant with oxygen mixed by 5% in CF4. Then, by soaking the above-mentioned silicon substrate in a xylene, the OBC was removed.

Figure 7H:
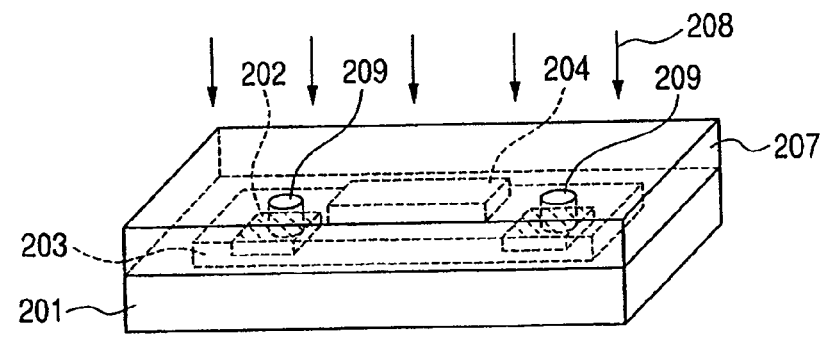
Figure 7I:
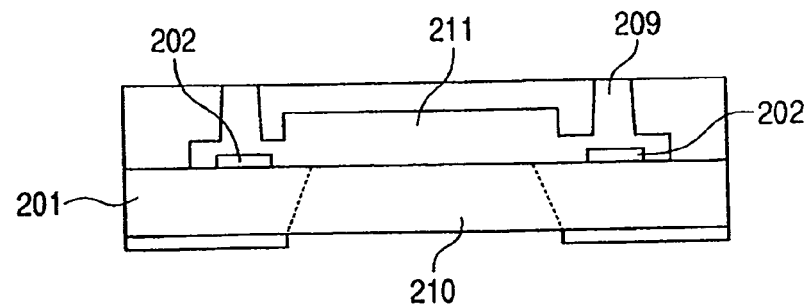
FIG. 7I is a schematic cross-sectional view of a liquid discharge head completed by the production method shown in FIGS. 7A to 7H.
Figure 8:
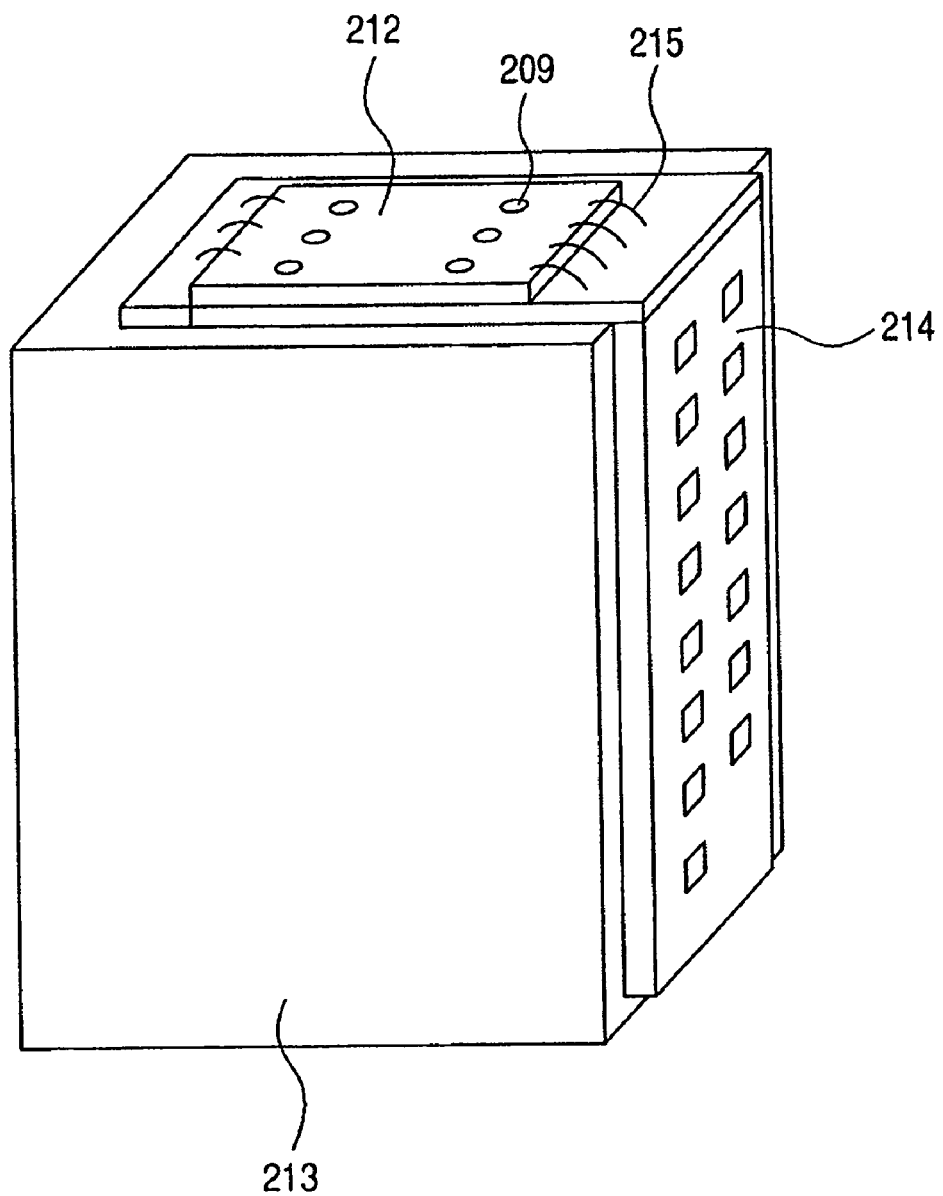
FIG. 8 is a schematic perspective view showing an ink jet head unit with the ink discharge element obtained by the production method shown in FIGS. 7A to 7H mounted.

Then, as shown in FIG. 7H, an ionizing radiation 208 of 300 nm or less was directed to the entire surface of the liquid flow path structure material 207 using a low pressure mercury lamp so as to decompose the upper layer positive type resist of a PMIPK and the lower layer positive type resist of a PMMA based copolymer. The exposing amount is 50 J/cm2.

Thereafter, by soaking the substrate 201 in a methyl lactate, the mold resist was removed collectively. At the time, by placing the same in a 200 MHz megasonic vessel, the elution time was shortened. Thereby, an ink liquid flow path 211 including the discharge chamber was formed so as to manufacture an ink discharge element (see FIG. 7I) of a structure for guiding an ink from the ink supply port 210 to each discharge chamber via each ink liquid flow path 211 and for discharging ink from discharge port 209.

Figure 9A:
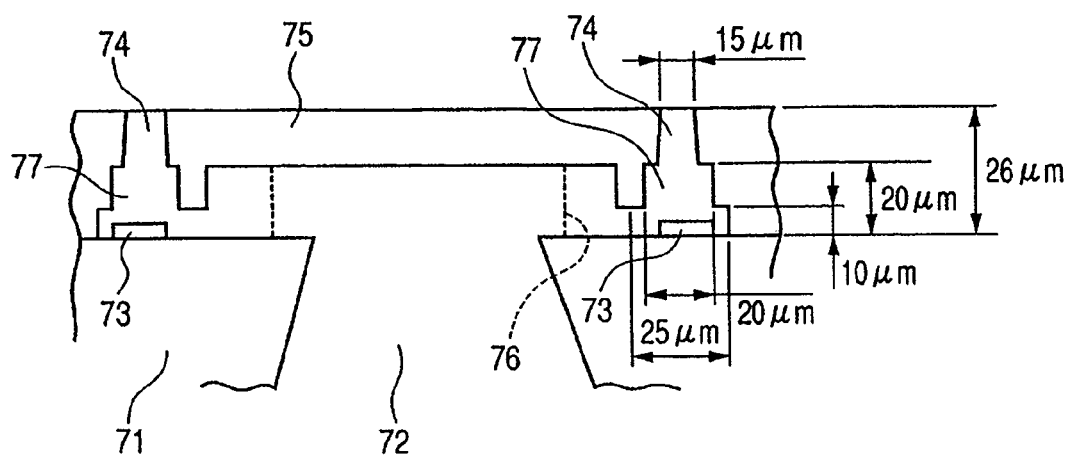
FIGS. 9A and 9B are diagrams each showing the nozzle structures of heads manufactured for the comparison of the discharge properties of the production method of the present invention and the conventional production method.
Figure 9B:
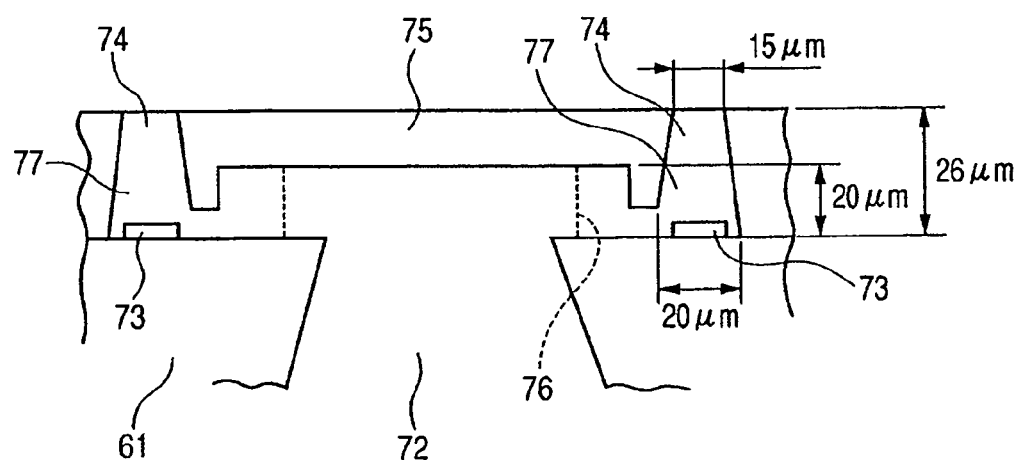

The discharge element manufactured accordingly was mounted in the ink jet head unit of the form shown in FIGS. 9A and 9B for carrying out the discharge and recording evaluation so as to find that a preferable image recording can be carried out. As to the form of the above-mentioned ink jet head unit, as shown in FIGS. 9A to 9B, for example, a TAB film 214 for providing and receiving a recording signal with the recording device main body is provided on the outer surface of a supporting member for supporting an ink tank 213 detachably, and an ink discharge element 212 is connected with an electric wiring via an electric connection lead 215 on the TAB film 214.

Modified Embodiment

According to the first embodiment, an ink jet head of the structure shown in FIG. 6A was manufactured. According to this embodiment, as shown in FIG. 9A, a discharge chamber 77 has a rectangular part formed with the lower layer resist of a 25 μm square and a 10 μm height, a rectangular part formed with the upper resist of a 20 μm square and a 10 μm height, and a discharge port of a 15 μm diameter round hole. The distance form the heater 73 to the opening surface of the discharge port is 26 μm. FIG. 9B shows the cross-sectional shape of the discharge port of the head by the conventional production method. The discharge chamber 77 is rectangular with a 20 μm side and a 20 μm height. The discharge port 72 is formed as a 15 μm diameter round hole. According to the comparison of the discharge properties of each of the heads of the FIGS. 9A to 9B, the head shown in FIG. 9A has the discharge rate of 15 m/sec by a 3 ng discharge amount, and the impact accuracy at a position away from the discharge port 74 in the discharge direction by 1 mm was 3 μm. Moreover, the head shown in FIG. 9B has the discharge rate of 9 m/sec by a 3 ng discharge amount, and the impact accuracy was 5 μm.

EXAMPLES

In order to examine the effects of the present invention, a head was manufactured and evaluated in the same way as it is mentioned in the first embodiment except that the following mold material forming material was used in the conditions shown in the table 1 in a form of a color head mounted in an IJ printer (PIXUS 560i) manufactured by Canon.

The mold material forming material used in the example 1 and the comparative examples 1, 2 was PMIPK and P(MMA-MAA). As to the PMIPK, ODUR-1010 commercially available by the Tokyo Ouka Kogyo Co., Ltd. was adjusted so as to have the resin concentration to 20 WT % and used. As to the P(MMA-MAA), resin powders synthesized so as to provide a radical polymerization product of a methyl methacrylate and a methacrylic acid (PMMA based copolymer), weight average molecular weight (Mw: based on the polystyrene)=170,000, dispersity (Mw/Mn)=2.3, dissolved in a diglyme solvent by about a 30 wt % solid component concentration, was used as a resist liquid 1, and resin powders synthesized so as to provide a radical polymerization product of a methyl methacrylate and a methacrylic acid (PMMA based copolymer), weight average molecular weight (Mw: based on the polystyrene)=30,000, dispersity (Mw/Mn)=2.1, dissolved in a diglyme solvent by about a 25 wt % solid component concentration, was used as a resist liquid 2.

Moreover, the mold material forming material used in the example 2 and the comparative example 3 was PMIPK and P(MMA-MAN). As to the PMIPK, ODUR-1010 commercially available by the Tokyo Ouka. Kogyo Co., Ltd. was adjusted so as to have the resin concentration to 20 WT % and used. As to the P(MMA-MAN), resin powders synthesized so as to provide a radical polymerization product of a methyl methacrylate and a methacrylic anhydride (PMMA based copolymer), weight average molecular weight (Mw: based on the polystyrene)=30,000, dispersity (Mw/Mn)=3.4, dissolved in a cyclohexanone solvent by about a 25 wt % solid component concentration, was used as a resist liquid.

As to the evaluation, cracking was judged by the generation ratio by the number of defect chips (M pieces) with the crack generation with respect to the number of the chips to be provided in a used wafer size (N pieces). As to the defect evaluation, with even one point in each chip, it judged as a defect goods.

The judging criteria were as follows:

○:(M/N)*100>90%

Δ:(M/N)*100<70%

Moreover, as to the residue, in the same manner, it was judged by the generation ratio. As to the nozzle yield, the value of (M/N)×100 of the number of the manufactured chips (M pieces) without cracking or residue with respect to the total number of the pieces (N pieces) in the used wafer size is shown. As to the printing yield, the value of (m/n)×100 of the number of the heads (m pieces) within 5 μm in terms of the unevenness value σ in a printing test by the printer with respect to the number of heads (n pieces) assembled as a head.

As it is apparent from the table 1 showing the results, according to the IJ heads manufactured by the configuration of the present invention, in both the upper layer and the lower layer, no film reduction, cracking or residue was found in the mold material, and both the nozzle yield and the printing yield were preferable.

On the other hand, according to the comparative examples 1, 3 manufactured by thermal cross linking, sensitivity deterioration and cracking were observed in the lower layer mold material with the thermal cross linking carried out, and furthermore, residue was observed. Then, in terms of both the nozzle yield and the printing yield, they were poorer than those manufactured by the configuration of the present invention. According to the comparative example 2, owing to the absence of the thermal cross linking, even though cracking, residue, or the like was not observed, film reduction was observed in the upper layer mold material, and furthermore, both the nozzle yield and the printing yield, they were drastically poorer than those manufactured by the configuration of the present invention.

The printing failure generated in the IJ heads manufactured by the configuration of the present invention was mainly the phenomenon without jumping the ink droplets from a part of the nozzles (it is referred to as the non discharge phenomenon) derived from dusts, or the like, introduced at the time of the head assembly (at the time of mounting). From the results, it is learned that in order to provide an inexpensive and highly reliable ink jet recording head, formation based on the production method of the present invention is preferable.

This application claims priority from Japanese Patent Application No. 2004-190481 filed Jun. 28, 2004, which is hereby incorporated by reference herein.

TABLE

| | Lower layer mold material | | | | Upper layer mold material | | | | Removing property | | | | | |
| --- | --- | --- | --- | --- | --- | --- | --- | --- | --- | --- | --- | --- | --- | --- |
| | Material | Film thickness | Sensitivity | Cracking | Material | Film thickness | Sensitivity | Film loss | Cracking | Irradiation amount | Removal time | Residue | Nozzle yield | Printing yield |
| Example 1 | PMIPK*[1] | 18 μM | 20 J | None | P(MMA-MMA)*[2] | 5 μM | 6 J | None | None | 51 J | 90 min. | None | 95% | 96% |
| Comparative Example 1 | P(MMA-MAA)*[3] | 18 μM | 50 J | Δ | PMIPK*[4] | 5 μM | 8 J | None | None | 270 J | 180 min. | Present | 65% | 60% |

TABLE-continued

| | Lower layer mold material | | | | Upper layer mold material | | | | Removing property | | | | |
|---|---|---|---|---|---|---|---|---|---|---|---|---|---|
| | Material | Film thickness | Sensitivity | Cracking | Material | Film thickness | Sensitivity | Film loss | Cracking | Irradiation amount | Removal time | Residue | Nozzle yield | Printing yield |
| Comparative Example 2 | PMIPK*[1] | 18 μM | 20 J | None | P(MMA-MAA)*[5] | 5 μM | 5 J | x (50%) | None | 51 J | 90 min. | None | 30% | 20% |
| Example 2 | PMIPK*[6] | 15 μM | 18 J | None | P(MMA-MAA)*[7] | 5 μM | 6 J | None | None | 51 J | 90 min. | None | 94% | 97% |
| Comparative Example 3 | P(MMA-MAA)*[8] | 15 μM | 50 J | Δ | PMIPK*[9] | 5 μM | 8 J | None | None | 270 J | 180 min. | Present | 68% | 66% |

*[1]For the PMIPK, a film was formed by pre baking (120° C., 3 minutes) after the application, and curing (150° C., 6 minutes).
*[2]For the (P(MMA-MAA): molecular weight: 170,000}, a film was formed by pre, baking (100° C., 3 minutes) after the application, and curing (150° C., 6 minutes).
*[3]For the (P(MMA-MAA): molecular weight: 30,000}, a film was formed by pre baking (100° C., 3 minutes) after the application, and curing (250° C., 1 hour).
*[4]For the PIMPK, a film was formed by pre baking (120° C., 3 minutes) after the application.
*[5]For the (P(MMA-MAA): molecular weight: 30,000}, a film was formed by pre baking (100° C., 3 minutes) after the application.
*[6]For the PMIPK, a film was formed by pre baking (120' C, 3 minutes) after the application, and curing (150° C., 6 minutes).
*[7]For the P(MMA-MAN), a film was formed by pre baking (100° C., 3 minutes) after the application, and curing (150° C., 6 minutes).
*[8]For the P(MMA-MAN), a film was formed by pre baking (100° C., 3 minutes) after the application, and curing (250° C., 1 hour).
*[9]For the PIMPK, a film was formed by pre baking (120° C., 3 minutes) after the application.

The invention claimed is:

1. A method for manufacturing a liquid discharge head comprising a passage for a liquid, which communicates with a discharge port for discharging the liquid, on a substrate with a liquid discharge energy generating element for generating energy used for discharging the liquid, the method comprising:
providing a first layer including a polymethyl isopropenyl ketone on the substrate;
providing, on the first layer, a second layer including a photosensitive material of a copolymer obtained by copolymerization of a methacrylate and a methacrylic acid, with a weight average molecular weight of the copolymer of 50,000 to 300,000 and a ratio of the methacrylic acid included in the copolymer of 5 to 30% by weight, where the second layer on the first layer is baked at a temperature of 100 to 150° C.;
forming a second part of a mold of the passage from the second layer by exposing a part of the second layer, and removing an exposed part of the second layer using a developing solution;
forming a first part of the mold of the passage from the first layer by exposing a part of the first layer, and removing an exposed part of the first layer using a developing solution;
providing a coating layer to coat the mold; and
removing the mold to form the passage.

2. The method for manufacturing a liquid discharge head according to claim 1, wherein a first wavelength of light used to expose the first layer is in a 270 nm to 350 nm range, and a second wavelength of light used to expose the second layer is in a 230 nm to 260 nm range.

3. A method for manufacturing a liquid discharge head comprising a passage of a liquid, which communicates with a discharge port for discharging the liquid, on a substrate with a liquid discharge energy generating element for generating energy used for discharging the liquid, the method comprising:
providing a first including a polymethyl isopropenyl ketone on the substrate;
providing, on the first layer, a second layer including a photosensitive material of a copolymer obtained by copolymerization of a methacrylate and a methacrylic anhydride, with a weight average molecular weight of the copolymer of 10,000 to 100,000 and a ratio of the methacrylic anhydride included in the copolymer of 5 to 30% by weight, where the second layer on the first layer is baked at a temperature of 100 to 150° C.;
forming a second part of a mold of the passage from the second layer by exposing a part of the second layer, and removing an exposed part of the second layer using a developing solution;
forming a first part of the mold of the passage from the first layer by exposing a part of the first layer, and removing an exposed part of the first layer using a developing solution;
providing a coating layer to coat the mold; and
removing the mold to form the passage.

4. The method for manufacturing a liquid discharge head according to claim 3, wherein a first wavelength of light used to expose the first layer is in a 270 nm to 350 nm range, and a second wavelength of light used to expose the second layer is in a 230 nm to 260 nm range.

* * * * *